(12) United States Patent
Shah

(10) Patent No.: US 11,244,088 B2
(45) Date of Patent: Feb. 8, 2022

(54) CUSTOMIZED RESPONSE FINITE ELEMENT MODEL FOR CRASH TEST DUMMY AND METHOD

(71) Applicant: Humanetics Innovative Solutions, Inc., Farmington Hills, MI (US)

(72) Inventor: Chirag Shah, South Lyon, MI (US)

(73) Assignee: Humanetics Innovative Solutions, Inc., Farmington Hills, MI (US)

( * ) Notice: Subject to any disclaimer, the term of this patent is extended or adjusted under 35 U.S.C. 154(b) by 567 days.

(21) Appl. No.: 15/942,200

(22) Filed: Mar. 30, 2018

(65) Prior Publication Data

US 2018/0285516 A1 Oct. 4, 2018

Related U.S. Application Data

(60) Provisional application No. 62/481,510, filed on Apr. 4, 2017, provisional application No. 62/481,545, filed on Apr. 4, 2017.

(51) Int. Cl.
 *G06F 30/17* (2020.01)
 *G06F 17/16* (2006.01)
 (Continued)

(52) U.S. Cl.
 CPC .............. *G06F 30/17* (2020.01); *G06F 17/16* (2013.01); *G06F 30/15* (2020.01); *G06F 30/23* (2020.01)

(58) Field of Classification Search
 CPC .......... G06F 30/17; G06F 30/23; G06F 30/15; G06F 17/16
 See application file for complete search history.

(56) References Cited

U.S. PATENT DOCUMENTS

| 3,757,431 A | 9/1973 | Daniel |
| 4,261,113 A | 4/1981 | Alderson |

(Continued)

OTHER PUBLICATIONS

Untaroiu, C. D., J. Shin, and Y-C. Lu. "Assessment of a dummy model in crash simulations using rating methods." International Journal of Automotive Technology 14, No. 3 (2013): 395-405. (Year: 2013).*

(Continued)

*Primary Examiner* — Chuen-Meei Gan
(74) *Attorney, Agent, or Firm* — Howard & Howard Attorneys PLLC

(57) ABSTRACT

A system for generating a customized response finite element model for a crash test dummy and the system is configured to implement a method of creating the customized response finite element model for the crash test dummy including the steps of selecting a plurality of finite element factors associated with a crash test dummy, selecting a performance parameter associated with the crash test dummy, and identifying a certification test value associated with the selected performance parameter. The method also includes the steps of determining a performance parameter value as a function of the plurality of finite element factors, determining an optimized factor value for each of the finite element factors to minimize a difference between the performance parameter value and the certification test value, and generating a customized response finite element model for the crash test dummy using the determined optimized value of each of the finite element factors.

17 Claims, 21 Drawing Sheets

Specific Test – High Tibia Moments

(51) Int. Cl.
*G06F 30/15* (2020.01)
*G06F 30/23* (2020.01)

(56) References Cited

U.S. PATENT DOCUMENTS

| | | | |
|---|---|---|---|
| 5,317,931 | A | 6/1994 | Kalami |
| 7,086,273 | B2 | 8/2006 | Lipmyer |
| 7,508,530 | B1 | 3/2009 | Handman |
| 8,407,033 | B2 | 3/2013 | Cooper et al. |
| 9,043,187 | B2 * | 5/2015 | Pang ................. G06F 30/23 703/2 |
| 9,355,575 | B2 | 5/2016 | Wang |
| 2004/0099825 | A1 | 5/2004 | Huang et al. |
| 2006/0095235 | A1 | 5/2006 | Furtado et al. |
| 2011/0144955 | A1 * | 6/2011 | Cooper ................. G06F 30/15 703/1 |
| 2011/0197688 | A1 * | 8/2011 | Forbes .............. G01M 17/0078 73/865.1 |

OTHER PUBLICATIONS

Maatouki, "Latest Developments of LS-Dynatest Dummy Models", Oct. 2014 [retrieved on Oct. 19, 2016], Retrieved from the Internet: https://www.dynamore.se/en/resources/papers/2014-nordic-is-dyna-forum-2013-presentations/latest-developments-of-is-dyna-test-dummy-models>, entire document.

* cited by examiner

| FE Factors for Customized Response FLEX-PLI Model (Factor) |||| 
|---|---|---|---|
| Legend (Factor) | Name | Minimum Value | Maximum Value |
| A ($X_1$) | Tibia bone core material property | -1.5 | 1.5 |
| B ($X_2$) | Inner/outer knee spring stiffness | -3 | 3 |
| C ($X_3$) | Friction between neoprene and rubber | -1 | 1 |
| D ($X_4$) | Friction between neoprene and hardware | -1 | 1 |
| E ($X_5$) | Friction between femur block and meniscus | -2 | 2 |

FIG. 6

| Injury Output Measurement (Parameter) ||| 
|---|---|---|
| Legend (Parameter) | Name | Equation |
| T1 ($Y_1$) | Upper Tibia Moment | T1 = 256.157 + 25.603 A + 2.698 B - 2.944 C - 4.175 D + 1.254 E - 0.497 A*B + 0.223 A*C + 0.086 A*D - 0.108 A*E + 0.404 B*C + 1.141 B*D + 3.421 B*E - 2.106 C*D + 0.510 C*E + 0.528 D*E |
| T2 ($Y_2$) | Mid Upper Tibia Moment | T2 = 238.237 + 18.347 A + 4.798 B - 3.571 C - 3.815 D - 1.091 E + 1.547 A*B + 0.499 A*C + 0.556 A*D - 1.679 A*E - 0.174 B*C - 0.824 B*D + 1.350 B*E - 1.839 C*D - 0.427 C*E + 0.974 D*E |
| T3 ($Y_3$) | Mid Lower Tibia Moment | T3 = 175.206 + 12.374 A + 6.464 B - 4.228 C + 0.035 D - 3.548 E + 0.043 A*B - 0.171 A*C + 0.030 A*D + 0.068 A*E - 0.111 B*C + 0.180 B*D - 1.670 B*E - 1.460 C*D + 1.126 C*E - 0.191 D*E |
| T4 ($Y_4$) | Lower Tibia Moment | T4 = 104.918 + 5.141 A + 2.698 B - 3.407 C + 1.661 D + 0.576 E - 0.777 A*B + 0.567 A*C - 0.238 A*D - 0.275 A*E - 0.054 B*C + 0.099 B*D + 0.875 B*E - 1.797 C*D + 0.853 C*E - 0.276 D*E |
| ACL ($Y_5$) | Anterior Cruciate Ligament | ACL = 9.693 - 0.213 A - 0.119 B + 0.054 C - 0.4 D - 0.24 E + 0.024 A*B + 0.03 A*C - 0.178 A*D + 0.056 A*E - 0.008 B*D - 0.081 C*D + 0.376 D*E |
| PCL ($Y_6$) | Posterior Cruciate Ligament | PCL = 4.941 + 0.029 A + 0.089 B + 0.086 C - 0.182 D1 - 0.418 E - 0.099 A*B + 0.09 A*C + 0.106 A*D + 0.089 A*E + 0.066 B*D - 0.05 C*D + 0.401 D*E |
| MCL ($Y_7$) | Medial Collateral Ligament | MCL = 20.5272 - 0.2854 A - 1.9109 B - 0.4639 C - 0.2060 D - 0.0041 E + 0.0544 A*B + 0.0658 A*C + 0.0729 A*D - 0.0959 A*E - 0.0542 B*C 0.0209 B*D - 0.0510 B*E + 0.0513 C*D - 0.0093 C*E - 0.0049 D*E |

FIG. 7

| Injury Output Measurement From Inverse Impact Test ||| 
|---|---|---|
| Parameter (Measurement Unit) | Name | Example of Parameter Value from Hardware Testing |
| T1 (Nm) | Upper Tibia Moment | 256.16 |
| T2 (Nm) | Mid Upper Tibia Moment | 238.24 |
| T3 (Nm) | Mid Lower Tibia Moment | 175.21 |
| T4 (Nm) | Lower Tibia Moment | 104.92 |
| ACL (mm) | Anterior Cruciate Ligament | 9.69 |
| PCL (mm) | Posterior Cruciate Ligament | 4.94 |
| MCL (mm) | Medial Collateral Ligament | 20.53 |

FIG. 8

| CAE Run Number | Input Factors* | | | | |
|---|---|---|---|---|---|
| | A ($X_1$) | B ($X_2$) | C ($X_3$) | D ($X_4$) | E ($X_5$) |
| 1 | -1 | -1 | 1 | 1 | 1 |
| 2 | 1 | -1 | -1 | -1 | 1 |
| 3 | 1 | 1 | -1 | 1 | 1 |
| 4 | -1 | 1 | -1 | -1 | -1 |
| 5 | -1 | -1 | 1 | 1 | -1 |
| 6 | 1 | 1 | 1 | 1 | -1 |
| 7 | 1 | -1 | 1 | 1 | 1 |
| 8 | 1 | 1 | -1 | -1 | 1 |
| 9 | -1 | -1 | 1 | -1 | -1 |
| 10 | 1 | 1 | 1 | -1 | -1 |
| 11 | 1 | 1 | 1 | 1 | 1 |
| 12 | -1 | 1 | 1 | 1 | -1 |
| 13 | -1 | -1 | -1 | -1 | -1 |
| 14 | 1 | -1 | 1 | -1 | -1 |
| 15 | 1 | -1 | -1 | 1 | 1 |
| 16 | -1 | 1 | 1 | 1 | 1 |
| 17 | -1 | -1 | -1 | 1 | -1 |
| 18 | 1 | 1 | -1 | 1 | -1 |
| 19 | -1 | -1 | -1 | 1 | 1 |
| 20 | 1 | -1 | 1 | -1 | 1 |
| 21 | 1 | 1 | 1 | -1 | 1 |
| 22 | -1 | 1 | -1 | 1 | 1 |
| 23 | 1 | 1 | -1 | -1 | -1 |
| 24 | 1 | -1 | -1 | 1 | -1 |
| 25 | -1 | -1 | -1 | -1 | 1 |
| 26 | -1 | 1 | -1 | -1 | 1 |
| 27 | -1 | -1 | 1 | -1 | 1 |
| 28 | 1 | -1 | -1 | -1 | -1 |
| 29 | 1 | -1 | 1 | 1 | -1 |
| 30 | -1 | 1 | 1 | -1 | -1 |
| 31 | -1 | 1 | 1 | -1 | 1 |
| 32 | -1 | 1 | -1 | 1 | -1 |

*Note: Factors are coded units: -1 represents the lower limit (minimum) and 1 the upper limit (maximum)

FIG. 9

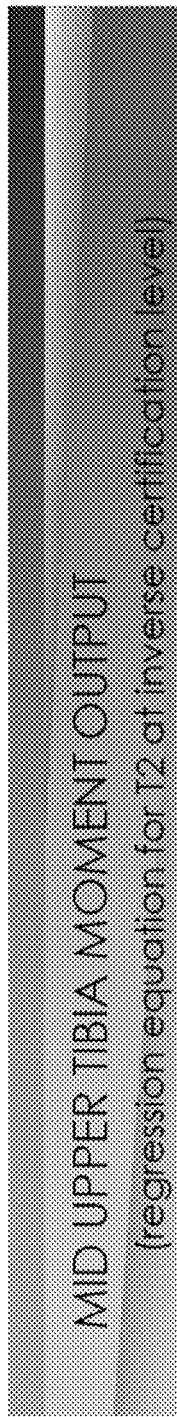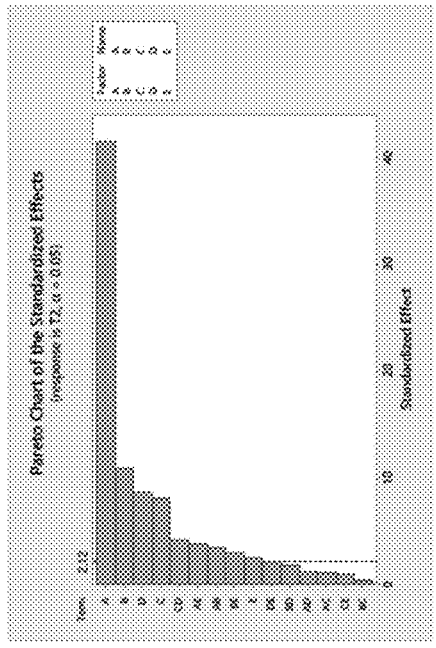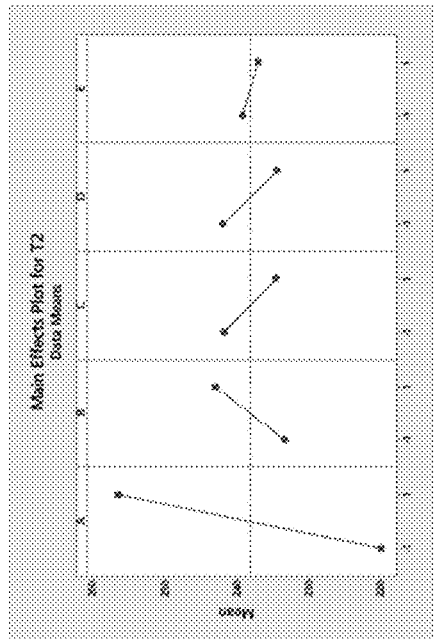
FIG. 12

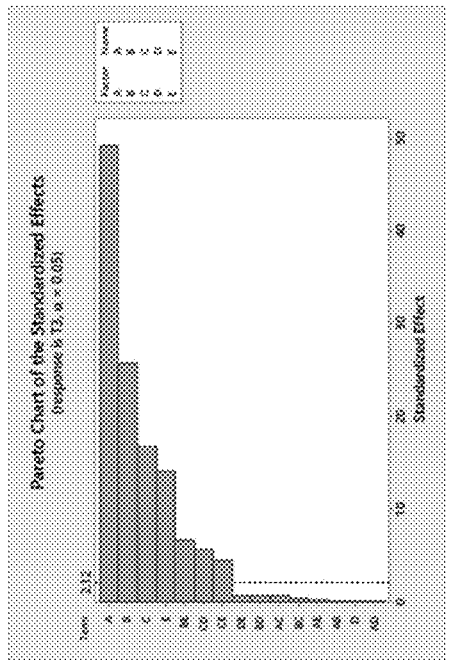
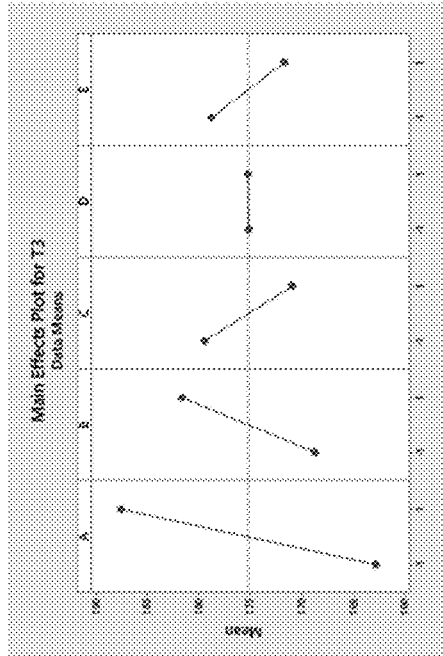
FIG. 13

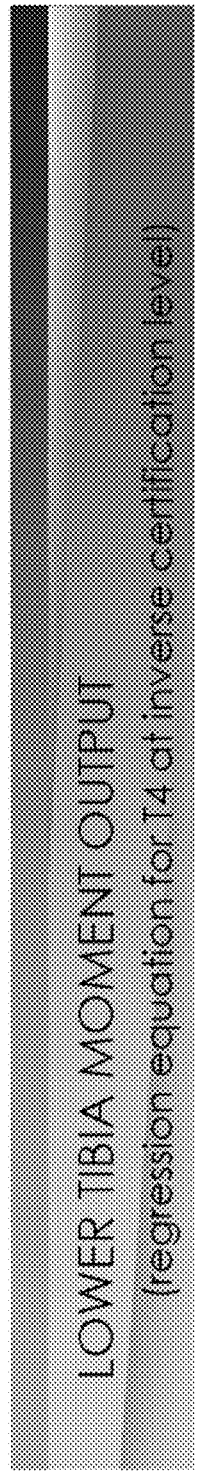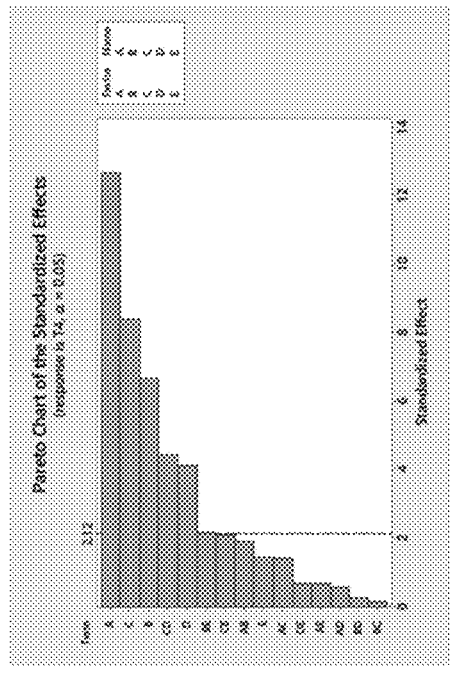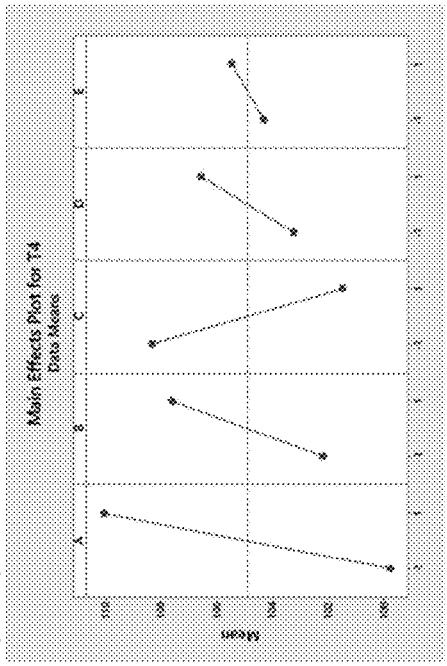
FIG. 14

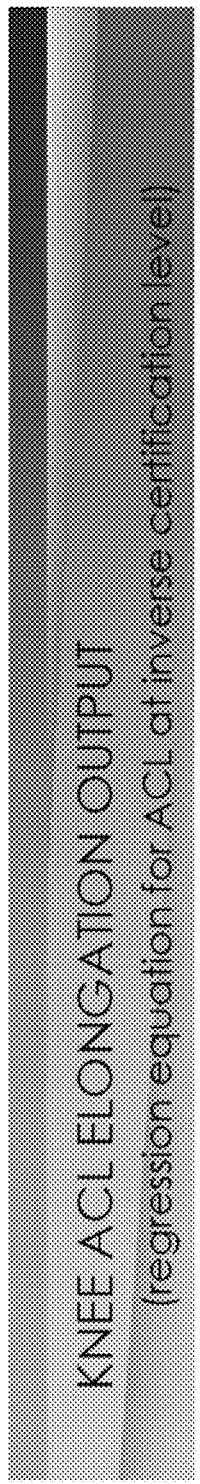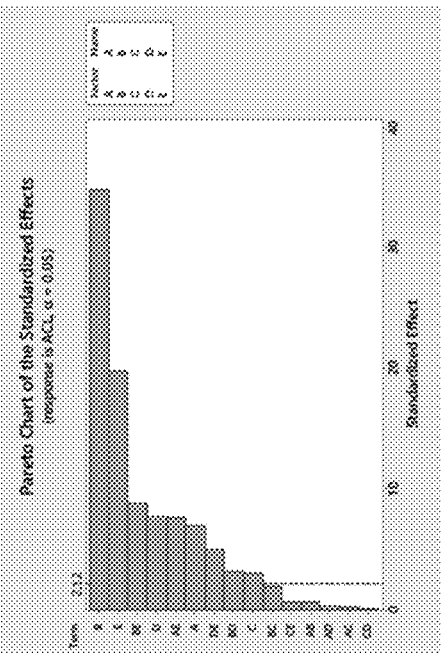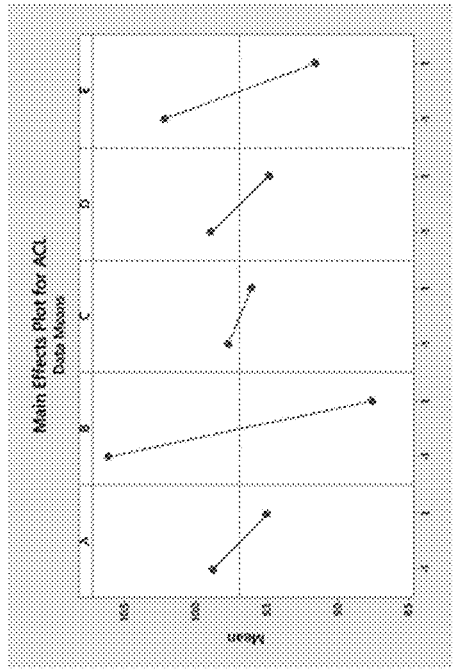
FIG. 15

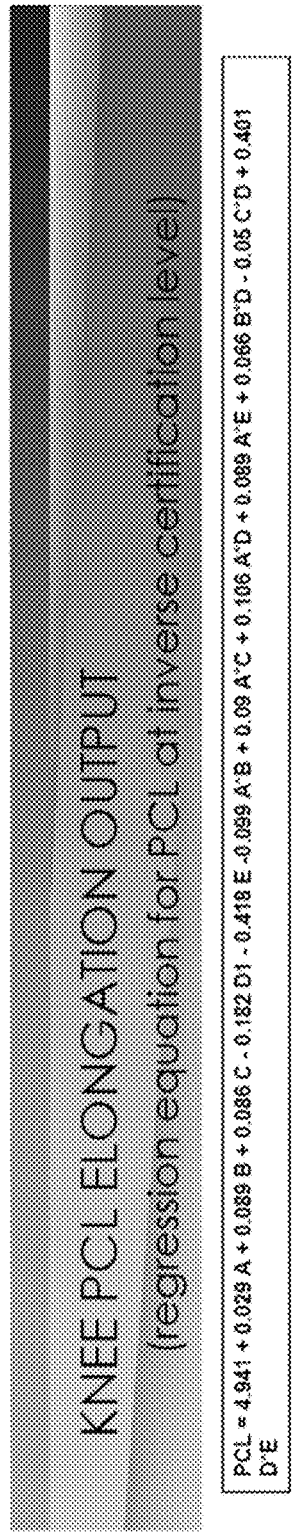
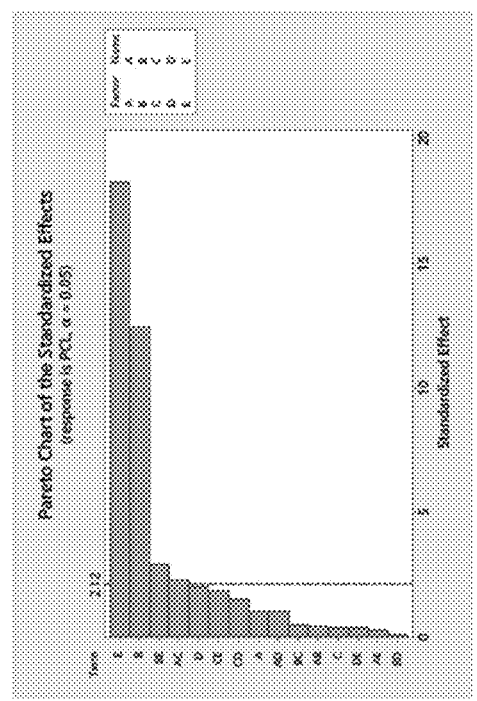
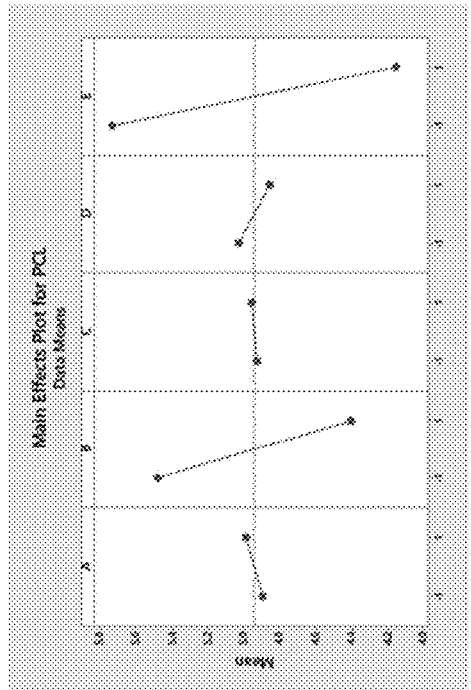
FIG. 16

CUSTOMIZED RESPONSE FINITE ELEMENT MODEL FOR CRASH TEST DUMMY AND METHOD

CROSS-REFERENCE TO RELATED APPLICATION(S)

The present application claims the benefit of U.S. Provisional Patent Application Ser. No. 62/481,510, filed Apr. 4, 2017 and U.S. Provisional Patent Application Ser. No. 62/481,545, filed Apr. 4, 2017, both disclosures of which are hereby expressly incorporated by reference herein.

BACKGROUND OF THE INVENTION

1. Field of the Invention

The present invention relates generally to crash test dummies and, more particularly, to a system and method for generating a customized response of a finite element model of an anthropometric test device (ATD) commonly known as a crash test dummy.

2. Description of the Related Art

Automotive, aviation, and other vehicle manufacturers conduct a wide variety of collision testing to measure the effects of a collision on a vehicle and its occupants. Through collision testing, a vehicle manufacturer gains valuable information that can be used to improve the vehicle, authorities examine vehicles to submit type approval, and consumer organizations provide information on vehicle safety ratings to the public.

Collision testing often involves the use of anthropomorphic test devices, better known as "crash test dummies", to estimate a human's injury risk. The crash test dummy must possess the general mechanical properties, dimensions, masses, joints, and joint stiffness of the humans of interest. In addition, they must possess sufficient mechanical impact response similitude and sensitivity to cause them to interact with the vehicle's interior in a human-like manner.

The crash test dummy is a generic term and broadly defined as the device or tool to evaluate and compare performance of vehicles in automotive crashes based on injury risk predicted by the crash test dummies. Typically, most dummies include a head assembly, spine assembly, neck assembly, rib cage assembly, abdomen, pelvis assembly, right and left arm assemblies, and right and left leg assemblies. The pedestrian leg-form dummy (referred to hereafter as FLEX-PLI) includes only the leg assembly. The FLEX-PLI has femur, knee and tibia assemblies. The femur assembly is connected to the knee assembly and the knee assembly is further connected to the tibia assembly. This dummy hardware structure is representative of human leg anatomy and is capable of predicting injuries to a human leg during vehicle collisions with pedestrians.

Currently, there is dummy-to-dummy variability seen in dummy injury prediction signals of physical test dummies in certification, sled, and vehicle testing due to differences in materials, manufacturing, and environment. As a result, there is a need in the art for a dummy finite element model to enable users to adjust a behavior of a dummy model on their hardware or physical dummy so as to quantify its characteristics from a certification level to their sled or vehicle environment.

There is also a need in the art for a dummy finite element model that not only captures a phenomenon of variability, but also allows users to perform robustness studies using extremes of certification corridors. Thus, there is a need in the art for a customized response finite element dummy model for a crash test dummy and method of creating the customized response finite element model that meets at least one of these needs. It should be appreciated that the "Customized Response" may be used interchangeably with "Borderline" as a commercial nomenclature.

SUMMARY OF THE INVENTION

The present invention provides a computer-implemented method of creating a customized response finite element model for a crash test dummy. The method includes the steps of selecting a plurality of finite element factors associated with a crash test dummy, selecting a performance parameter associated with the crash test dummy, and identifying a certification test value associated with the selected performance parameter. The method also includes the steps of determining a performance parameter value as a function of the plurality of finite element factors and determining an optimized factor value for each of the finite element factors to minimize a difference between the performance parameter value and the certification test value. The method further includes the steps of generating a customized response finite element model for the crash test dummy using the determined optimized value of each of the finite element factors.

One advantage of the present invention is that a customized response finite element model and method is provided for a crash test dummy. Another advantage of the present invention is that the customized response finite element model and method provides a customized model that bridges a gap between reality and simulation by better capturing hardware behavior, and lays a framework for future model applicable to other parts. Yet another advantage of the present invention is that the customized response finite element model and method enables users to adjust parameters based on their hardware dummy so as to quantify its characteristics from the certification level to their sled or vehicle environment. Still another advantage of the present invention is that the customized response finite element model and method not only captures the phenomenon of variability, but also allows users to perform robustness studies using the extremes of the certification corridors.

Other features and advantages of the present invention will be readily appreciated, as the same becomes better understood, after reading the subsequent description taken in conjunction with the accompanying drawings.

BRIEF DESCRIPTION OF THE DRAWINGS

FIG. 6 is an exemplary database for FE factors for customized response FLEX-PLI Model, according to an embodiment of the present invention;

FIGS. 7-9 are illustrations of exemplary database records generated by the system shown in FIG. 1, according to embodiments of the present invention;

FIGS. 10-18 are illustrations of exemplary screenshots that may be generated by the system shown in FIG. 1, according to embodiments of the present invention;

DESCRIPTION OF THE PREFERRED EMBODIMENT(S)

Figure 1:
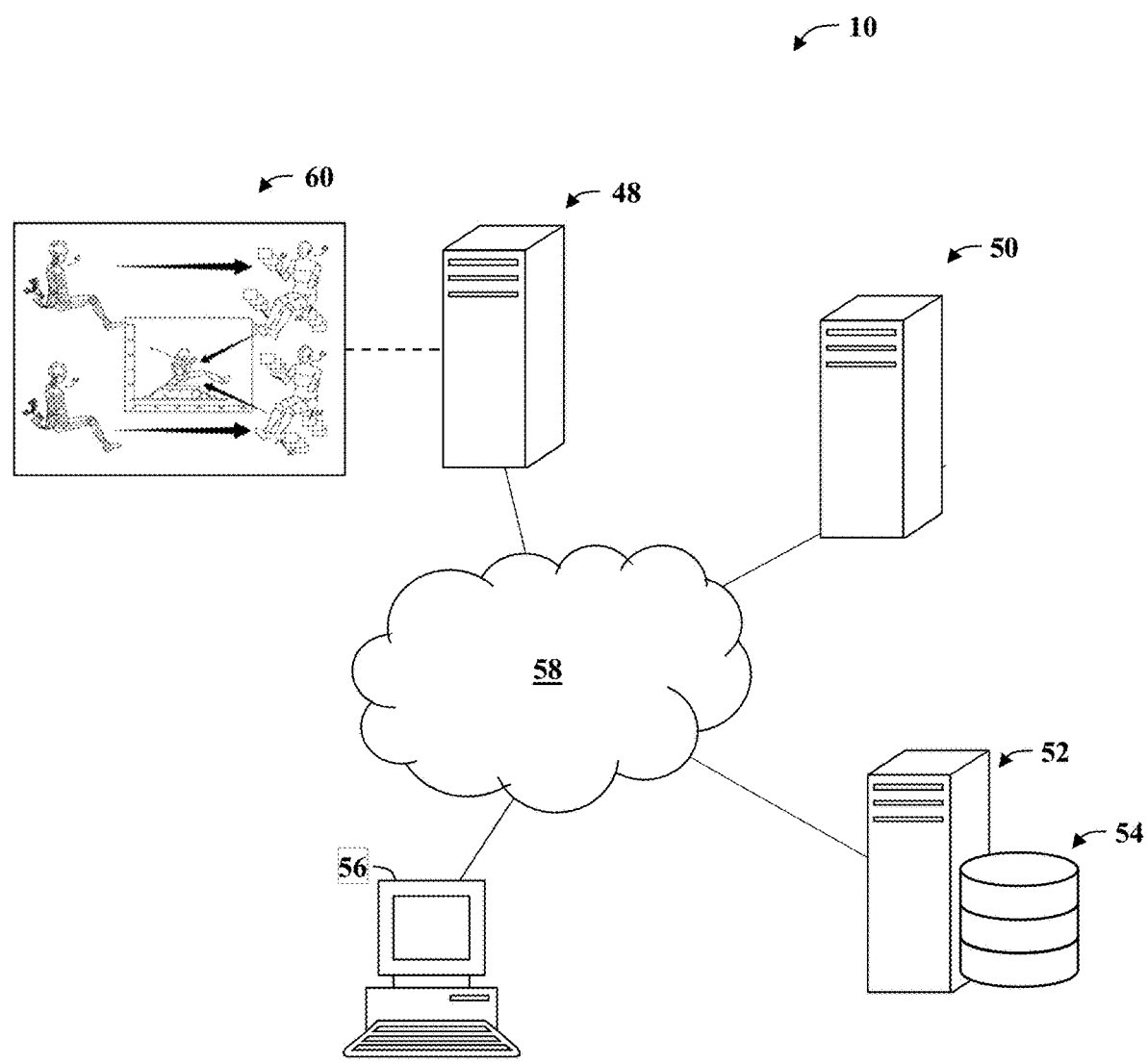
FIG. 1 is schematic view of a system for use in generating a customized response finite element model for a crash test dummy, according to an embodiment of the present invention.

The present invention overcomes the problem with known finite element systems by providing a system that is capable of creating customized response for any finite element dummy model. For example, in one embodiment, the system is configured to generate a finite model including a Flexible Pedestrian Leg-form Impactor (acronym as FLEX-PLI), pedestrian dummy model, which is used for evaluating injuries to pedestrians in crash events. It should be appreciated that the system is not limited to a pedestrian dummy finite element model, but can be extended and is applicable to a variety of other dummies using the same method as described herein.

In general, the present invention includes a system 10 (FIG. 1) that is configured to generate a customized finite element model for a crash test dummy (or dummy assembly or dummy component). The system 10 is configured to implement a method of creating the customized finite element model for the crash test dummy, according to the present invention, that includes a two-step approach that results in the customized finite element dummy model including: 1) establishing links between dummy parameters and factors; and 2) optimizing factors to minimize errors between the model and a specific test.

STEP 1: Establish links between dummy parameters and factors. In this step, the system 10 identifies all the potential finite element factors from the dummy for which the customized response is to be developed. Any model quantity such as material parameter, material stiffness, friction or any other finite element entity defined within the finite element dummy model is called a factor. For example, in one embodiment, the FLEX-PLI bone core material stiffness (a.k.a. "modulus of elasticity" in terms of Physical property of material) may be considered a factor. Each factor can have multiple levels. Minimum requirement for each factor is to have at least two levels. These two levels represent the range ("minimum" is one level and "maximum" is the other level) for each factor variation possible within the finite element dummy model. Any output injury measurement from the finite element dummy model or test is referred to as a parameter (or injury output measurement). For example, the FLEX-PLI tibia bone bending moment injury output from the finite element model or the corresponding output from the dummy hardware is called a parameter. It should be appreciated that this parameter is used to evaluate for subsequent injury prediction and regulatory purpose to rate the vehicles for their performance.

In one embodiment, the system 10 implements a method, according to the present invention, that is designed to work for any number of factors (say "n") denoted as X (X1, X2, X3, . . . Xn) and any number of parameters (say "m") denoted as Y (Y1, Y2, Y3, . . . Ym) by solving them using any of the commercially available statistical Design of Experiment ("DOE") tools. For example, in one embodiment, the FLEX-PLI model may include a total of five (5) identified factors (X1, X2, X3, X4, and X5) and seven (7) parameters or injury outputs measurements (Y1, Y2, Y3, Y4, Y5, Y6, and Y7) used to customize the model.

The total number of factors and levels of each factor (minimum of two) will determine the size of the DOE matrix and can be adjusted (increased or reduced) based on specific customized response finite element model development application. Different customized response finite element model applications may have different numbers and types of factor and the resulting size of the DOE matrix.

The system 10 is configured to determine an equation as a result of a design of experiments (DOE) algorithm solution for each individual parameter (Y1, Y2, Y3, . . . Ym) in terms of all the defined factors (X1, X2, X3, . . . Xn). The equation for each parameter is unique and obtained simultaneously in the DOE algorithm. Each parameter equation links all the defined factors (X1, X2, X3, . . . Xn) such that it will influence the parameter behavior in the form of unique and constant coefficients in the equation for the parameter. A total number of equations will always be equal to the total number of parameters defined in the system 10. It should be appreciated that these parameter equations are subsequently used in STEP 2.

STEP 2: Optimize factors to minimize errors between the model and a specific test. In this step, the equations obtained for each parameter are optimized so that the gap (or error) in the finite element model prediction and the selected test parameter values can be minimized. Any test that meets the dummy hardware qualification (certification) requirements can be selected from the entire test data set and is considered as the target test. This is achieved with a commercially available tool (such as Microsoft Excel or similar) which has capabilities to do non-linear regression analysis to minimize the sum of squared errors. This tool will use sum of squared errors between the calculated value and the test data value, using the following equation:

$$\text{Total Error} = \sum_{t=1}^{m} (Y_{cal} - Y_{test})^2 \quad \text{Equation (1)}$$

wherein, in the above equation, $Y_{cal}$ is obtained from the regression equation (derived in STEP 1) for a specific parameter (as defined in STEP 1) and $Y_{test}$ is the test data peak value for the same parameter from a specific test condition.

The process repeats for all the "m" number of parameters and added to the total cumulative error depicted as "Total Error" in Equation (1). The objective of STEP 2 is to find the optimal values for factors (X1, X2, X3, . . . Xn) such that the error between the model output from the regression equations of STEP 1 and the selected test peak values can be minimized to the extent possible.

These optimal factor values ($X_1, X_2, X_3, \ldots X_n$) serve as the basis for the development of a customized response finite element dummy model. These parameters are indirect scale factors for materials, stiffness, friction, and any other pertinent finite element quantity appropriately selected as a factor (and is defined in the model) to transform the finite element dummy model response to mimic specific hardware or a specific test condition or evaluation of extreme values within possible hardware dummy measurement range.

Due to the very nature and flexibility, this method will target a very specific test that has variability. There is no limit to possible solutions within the reasonable bound of hardware limits. It should be appreciated that the system 10 is capable of predicting all these possible solutions very reasonably.

In one embodiment, a customized response finite element model for the crash test dummy is to be carried out on a system 10 that includes a computer having a memory, a processor, a display and user input mechanism, such as a mouse or keyboard (not shown). The DOE and regression analyses are implemented on the system 10 in any commercial statistical tool with capabilities of carrying out DOE (STEP 1) and non-linear regression (STEP 2) analyses, which is commercially available from Minitab, MATLAB, Altair Hyper-Study or LS-OPT (LSTC). Efficient numerical algorithms are used and coded, making it possible that a complete analysis can be done within minutes on a Pentium processor based computer system. It should be appreciated that the computer is conventional and known in the art.

The customized response finite element model is evaluated at all levels of correlation to ensure that the response was reasonable. A customized response finite element model will use user-defined input factors. The number of factors will be the same as defined earlier (X1, X2, X3, . . . Xn). These optimized factors will be used in the dummy model file which calibrate material cards, friction values, and material stiffness to reproduce a dummy certification from the test specified input.

As previously described, there is dummy-to-dummy variability seen in the physical dummies (at the certification, sled, and vehicle tests) due to differences in material, manufacturing, environment, aging effects, and other factors. It should be appreciated that this customization, based on certification test data from a physical dummy, enables the user to accurately quantify or predict the dummy's response at the sled or vehicle level.

The reliability of the customized response finite element model was validated across numerous components, sled, and vehicle load cases. It should be appreciated that, although the customized response finite element model was developed for a particular type of crash test dummy through customization, the invented method can be applicable to any other crash test dummy.

Accordingly, in one embodiment, the present invention includes a customized finite element dummy model that can precisely represent any physical dummy passing certification, thus giving better control of variability. The customized response finite element model is a first of its kind model that bridges the gap between reality and simulation by taking variability into account. In addition, the customized response finite element model provides the framework for future finite element models and can be applied to other parts to better capture hardware behavior of the crash test dummy.

In one embodiment, the system 10 is configured to implement a method of creating a customized response finite element model for a crash test dummy. The system 10 is configured to identify relationships between the dummy model factors and injury output measurement parameters and optimize the factors to bridge the gap between model predicted response against a specific test condition. The system 10 uses the optimized factors to calibrate material parameters, material stiffness, friction, and any other relevant finite element quantity in the model. The system 10 also creates a single response finite element model for the crash test dummy with user-defined input parameters that define the customized response. In addition, the system 10 generates a customized response that is equal to parameters $(Y_1, Y_2, Y_3, \ldots Y_m)$ at the certification level. The system 10 also internally calibrates material cards for a dummy using a script to reproduce a specific test target.

The system 10 is also configured to capture leg-form variability in material properties, knee springs stiffness, and friction coefficients from physical hardware, using a customized response model. For example, the customized response FLEX-PLI model reproduces upper tibia moment, knee elongation, and femur moment to the 'user input' at inverse certification level. Materials cards, knee's spring stiffness, and contact friction coefficients are self-adjusted based on regression equations, and hence the users are equipped with an accurate FE model tailor-made to their physical leg-form. In addition, a default value for stiffer and softer responses is provided based on multiple hardware's inverse certification tests. However the customized response equations were validated for the entire inverse certification corridor range.

In one embodiment, a total of seven (7) injury output measurements or parameters $(Y_1, Y_2, Y_3, Y_4, Y_5, Y_6,$ and $Y_7)$ may be used. The system 10 generates seven regression equations using design of experiments (DOE) and implemented in one Excel spreadsheet. The system 10 allows users to input moment and elongation values from the hardware's inverse certification test. The system 10 then runs an optimization solver tool, and then copies the optimal factor values generated with the solver in their FLEX-PLI main file. In one embodiment, the optimal factor values are entered in the '$X_1, X_2, X_3, X_4,$ and $X_5$' fields of the *PARAMETER card in the main FLEX-PLI model file.

The system 10 is also configured to use DOE Factorial design to obtain one regression equation for each injury output measurement (parameter) in relation to the five input factors $(X_1, X_2, X_3, X_4,$ and $X_5)$ during the inverse certification load case.

Figure 18:
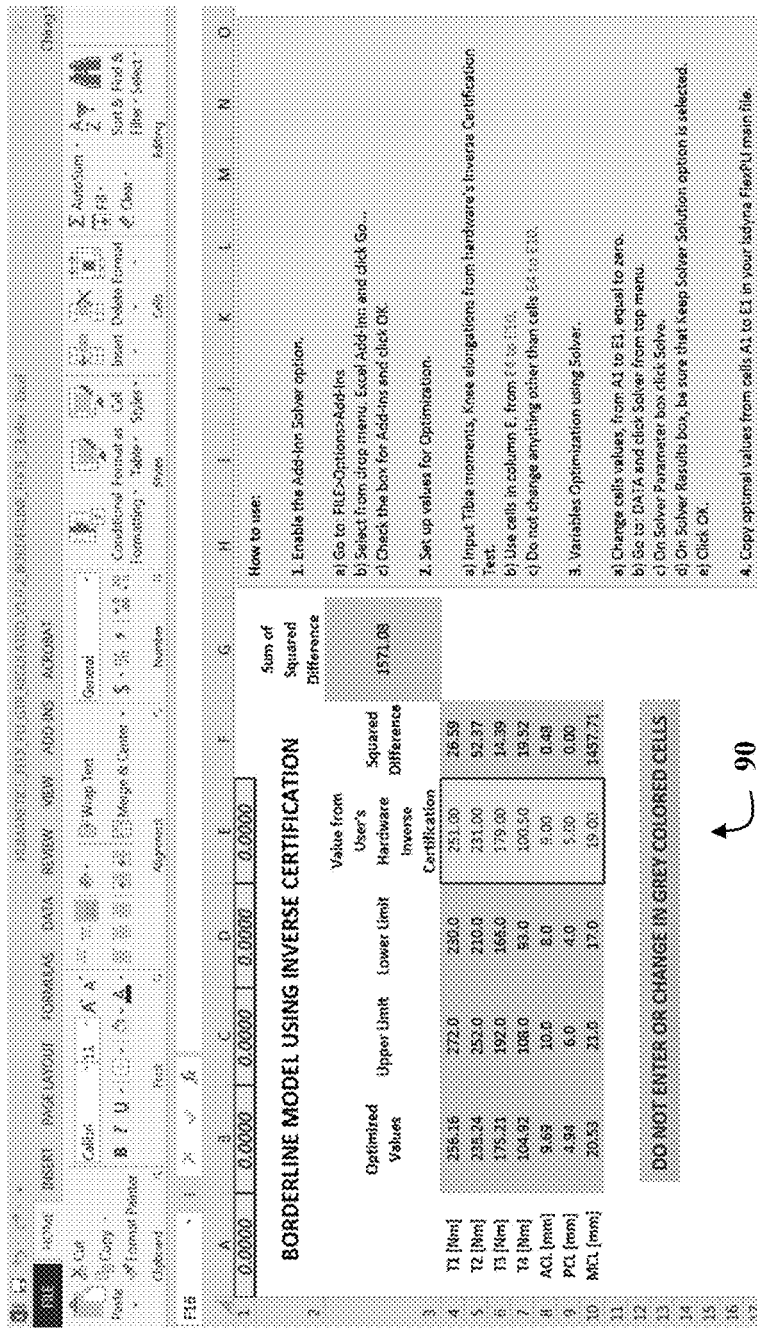

In one embodiment, the system 10 may generate an optimization screen (shown in FIG. 18) on a user computing device that includes an MS Excel™ spreadsheet including a solver add-in program. The system 10 uses the solver add-in program to find an optimal value for the five factors, from all previous regression equations, and minimize the difference between the CAE model and the desirable values obtained from hardware's inverse certification tests; those variables are subjected to specific limits. Solver will adjust the values for the five decision factor cells to satisfy the limits, and is going to minimize the sum of squared differences between user test input and the resulting value from regression. Once the system 10 generates the optimal value for each factor from the first row of the Excel's spreadsheet, the user needs to copy those values in the main input file for the FLEX-PLI impactor (as the procedure explained in the Excel file). Those optimal factor values may then be entered in the 'A1, B1, C1, D1, E1,' fields of the *PARAMETER card in the master leg-form FE solver input file.

Figure 2:
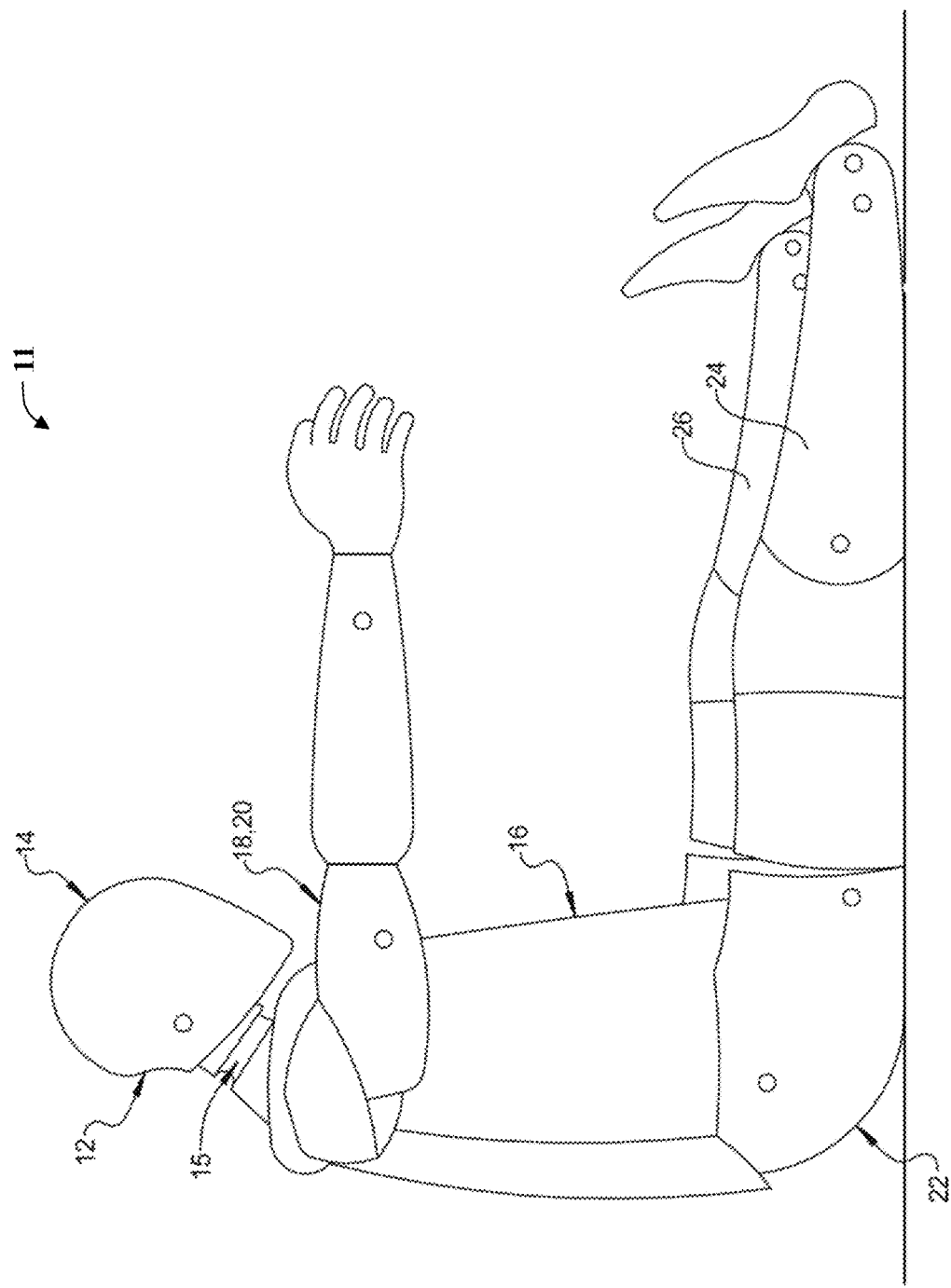
FIG. 2 is an elevational view of one embodiment of a finite element model of a crash test dummy.

Referring to FIGS. 1 and 2, in one embodiment, the system 10 is configured to generate a finite element (FE) model 11 of a crash test dummy, generally indicated at 12. The crash test dummy 12 is of a fiftieth percentile (50%) male type and is illustrated in a seated position. This crash test dummy 12 is used primarily to test the performance of automotive interiors and restraint systems for front and rear seat occupants. The size and weight of the crash test dummy 12 are based on anthropometric studies, which are typically done separately by the following organizations, University of Michigan Transportation Research Institute (UMTRI), U.S. Military Anthropometry Survey (ANSUR), and Civilian American and European Surface Anthropometry Resource (CESAR). It should be appreciated that ranges of motions, centers of gravity, and segment masses simulate those of human subjects defined by the anthropometric data.

As illustrated in FIG. 2, the crash test dummy 12 includes a head assembly, generally indicated at 14. The crash test dummy 12 also includes a neck assembly, generally indicated at 15, having an upper end mounted to the head assembly 14 and a lower end mounted to a spine assembly (not shown) extending into a torso area of the crash test dummy 12.

The torso area of the crash test dummy 12 also includes a rib cage or torso assembly, generally indicated at 16, connected to the spine assembly. The crash test dummy 12 also has a pair of arm assemblies including a right arm assembly, generally indicated at 18, and a left arm assembly, generally indicated at 20, which are attached to the spine assembly of the crash test dummy 12. It should be appreciated that a lower end of the spine assembly is connected to a lumbar-thoracic adapter (not shown), which is connected to a lumbar to pelvic adapter (not shown). It should also be appreciated that the neck assembly 15 may be part of the spine assembly. The crash test dummy 12 includes a pelvis assembly, generally indicated at 22, connected to the adapter. The crash test dummy 12 includes a right leg assembly 24 and a left leg assembly 26, which are attached to the pelvis assembly 22. It should be appreciated that various components of the crash test dummy 12 may be covered in a polyvinyl skin such as a flesh and skin assembly for biofidelity of the crash test dummy 12. In one embodiment, the FE model 11 is to be generated using MATLAB™, which is commercially available from MathWorks, coupled with other lower level languages. Efficient numerical algorithms (Genetic Algorithm) are used and coded, making it possible that a complete analysis can be done within minutes on a Pentium computer of the computer system. It should be appreciated that the computer system is conventional and known in the art.

Figure 3:
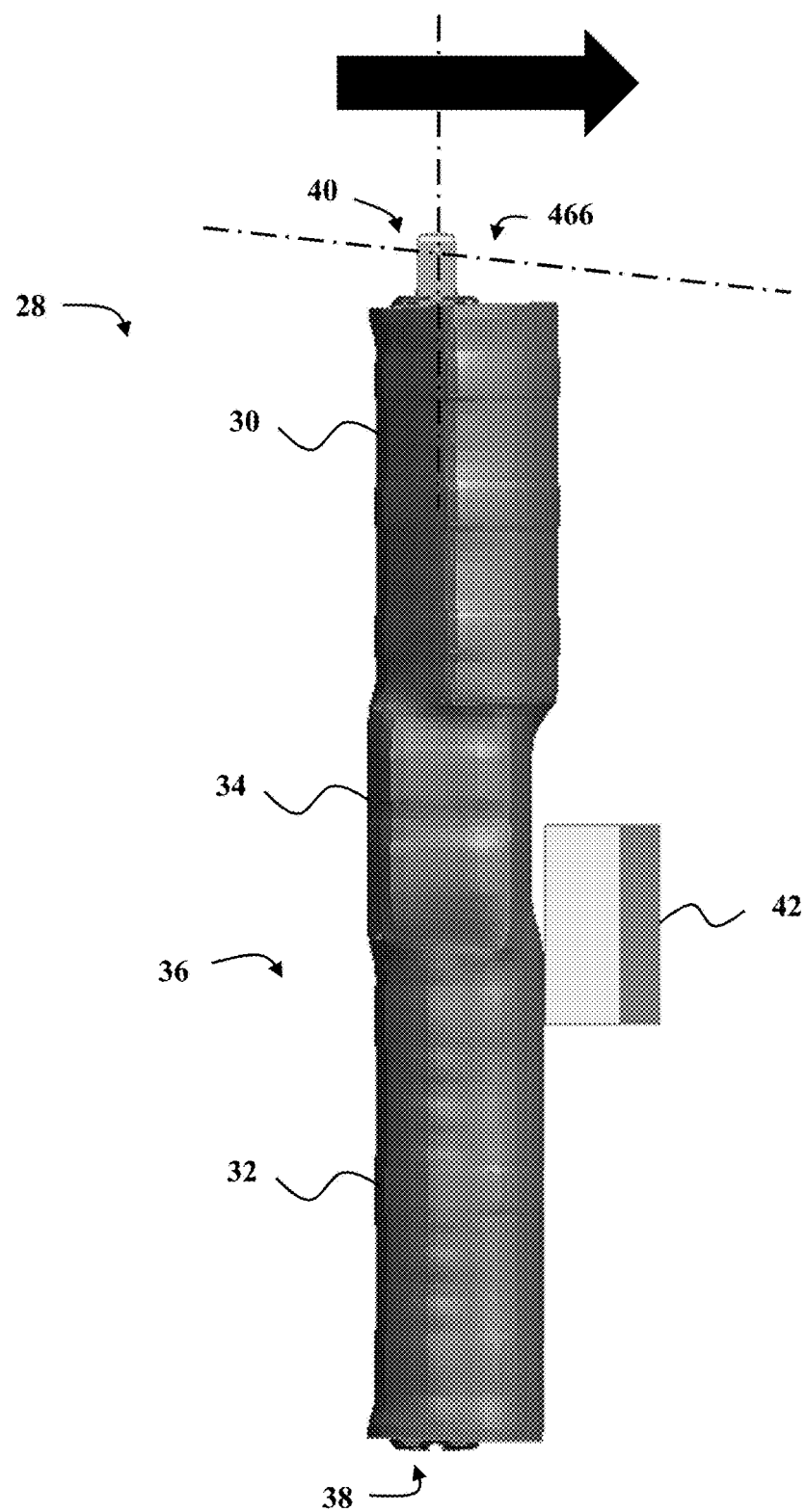
FIG. 3 is an elevational view of a FLEX-PLI inverse in an impact test for a FLEX-PLI leg assembly of the crash test dummy of FIG. 2.

Referring to FIG. 3, in one embodiment, the system 10 may be configured to generate the finite element model of Flexible Pedestrian Leg-form Impactor (acronym as FLEX-PLI) pedestrian dummy model 28. In the illustrated embodiment, the pedestrian dummy model 28 includes a tibia bone assembly 30, a femur bone assembly 32, a knee assembly 34, and a neoprene cover assembly 36.

In the illustrated embodiment, the system 10 is configured to generate the pedestrian dummy model 28 for use in simulating inverse impact testing for inverse certification tests of the pedestrian dummy model assembly 28. For example, in one embodiment, an inverse test apparatus (not shown) is used that includes a frame that is pivotally connected to the connection assembly 40 of the pedestrian dummy model 28, and a stopper block 42 positioned a vertical distance from the frame. During impact testing, the FLEX-PLI pedestrian dummy model 28 is positioned at an initial position oriented approximately 15° above a horizontal plane. The FLEX-PLI pedestrian dummy model 28 is then released and allowed to pivot about a pivot axis 46 to contact the stopper block 42. The finite element model 11 is configured to mimic load cell sensors positioned along a physical hardware that are used to measure flexion and elongation of a hardware dummy model during a physical inverse impact test to get the corresponding values for the finite element model.

Referring to FIG. 1, in the illustrated embodiment, the system 10 includes a certification testing server 48, an optimization server 50, a database server 52, a database 54, and one or more user computing devices 56 that are each coupled in communication via a communications network 58. The communications network 58 may be any suitable connection, including the Internet, file transfer protocol (FTP), an Intranet, LAN, a virtual private network (VPN), cellular networks, etc. . . . , and may utilize any suitable or combination of technologies including, but not limited to wired and wireless connections, always on connections, connections made periodically, and connections made as needed. Each server may include a server computer that includes a processing device that includes a processor that is coupled to a memory device. The processing device executes various programs, and thereby controls components of the server according to user instructions received from the user computing devices and/or other servers. The processing device may include memory, e.g., read only memory (ROM) and random access memory (RAM), storing processor-executable instructions and one or more processors that execute the processor-executable instructions.

The user computing device 56 may include any suitable device that includes a display device configured to display graphical user images to the user and a user input device, such as, for example, a keyboard and/or mouse, that enables a user to access and communicate with the system 10 including sending and/or receiving information to and from the system 10 and displaying information received from the system 10 to a user. The user computing device 56 may include a processing device that includes a processor that is coupled to a memory device. The processing device executes various programs, and thereby controls components of the user computing device 56 according to user instructions received via the user input device and/or server computers. For example, in one embodiment, the user computing device 56 may include, but is not limited to, a desktop computer, a laptop or notebook computer, a tablet computer, smartphone/tablet computer hybrid, a personal data assistant, a handheld mobile device including a cellular telephone, and the like. In addition, the user computing device 56 may include a touchscreen that operates as the display device and the user input device.

In the illustrated embodiment, the certification testing server 48 is coupled to an inverse impact testing apparatus 60 that is used to conduct physical inverse impact testing of physical hardware dummy models. For example, in one embodiment, the certification testing server 48 is configured to received signals from various sensors coupled to the crash test dummy during the impact testing and to generate a plurality of injury output measurements using information received from the sensors. In one embodiment, the certification testing server 48 is configured to generate an injury output measurement data file 62 (shown in FIG. 8) including the injury output measurements generated based on the information received during the physical inverse impact testing and transmit the injury output measurement data file 62 to the database server 52 for use in storing the injury output measurement data file 62 in the database 54.

The database server 52 includes a memory device that is connected to the database 54 to retrieve and store information contained in the database 54. The database 54 contains information on a variety of matters, such as, for example, information for use in generating finite element models, injury output measurement data, injury output parameter regression equations, element factor values, model images, programming code and/or any suitable information that enables the system 10 to function as described herein. For example, in one embodiment, the database 54 may contain the injury output measurement data file 62 (shown in FIG. 8) that includes information received from the certification testing server 48 indicating injury output parameter values obtained from a physical inverse impact test performed on a hardware dummy model using the inverse impact testing apparatus 60.

In one embodiment, the database 54 may also include an element data file 64 that includes information associated with a plurality of finite element factors 66 (FIG. 6) associated with the crash test dummy or pedestrian dummy model 28. Each finite element factor 66 includes information associated with a physical attribute of the crash test dummy or pedestrian dummy model 28. For example, in one embodiment, the finite element factors 66 included in the element data file 64 may include, but are not limited to, tibia bone core material properties, femur bone core material properties, inner/outer knee's spring stiffness, neoprene cover material properties, rubber layers material properties, velcro straps material properties, friction between neoprene covers and velcro straps, friction between neoprene cover and rubber layers, friction between neoprene/rubber layers and hardware, and/or friction between femur block and meniscus block. In the illustrated embodiment, each finite element factor 66 includes a minimum certification value and a maximum certification value.

The database 54 may also include a performance parameter data file 68 (shown in FIG. 7) that includes information associated with performance parameter values associated with the crash test dummy or pedestrian dummy model 28. For example, in one embodiment, the performance parameter data file 68 may include parameter equations that are associated with each of the performance parameter values. The performance parameter value may include, but are not limited to, an upper tibia moment, a middle upper tibia moment, a middle lower tibia moment, a lower tibia moment, an anterior cruciate ligament flexion/elongation, a posterior cruciate ligament flexion/elongation, and a medial collateral ligament flexion/elongation.

The optimization server 50 is configured to generate a customized finite element model for a crash test dummy by establishing links between injury output parameters and input factors. In the illustrated embodiment, the optimization server 50 is configured to receive a request to generate a finite element model for the pedestrian dummy model 28 and identifies a plurality of finite element input factors 66 associated with the pedestrian dummy model 28. The optimization server 50 then selects a plurality of performance measurement equations 70 (FIG. 7) that may be used to estimate physical measurement data obtained from physical hardware inverse impact tests of a physical crash test dummy. The optimization server 50 is configured to determine parameter equations for each selected performance measurement parameter using each of the identified finite element input factors 66 associated with the pedestrian dummy model 28. For example, in one embodiment, the optimization server 50 may be configured to determine the parameter equations using a design of experiments (DOE) algorithm solution for each individual parameter ($Y_1, Y_2, Y_3, \ldots Y_m$) in terms all the defined input factors ($X_1, X_2, X_3, \ldots X_n$). The equation for each parameter is unique and obtained simultaneously in the DOE algorithm. Each parameter equation links all the defined factors ($X_1, X_2, X_3, \ldots X_n$) such that it will influence the parameter behavior in the form of unique and constant coefficients in the equation for the parameter. The total number of parameter equations equals the total number parameters identified by the optimization server 50.

The optimization server 50 is also configured to retrieve physical injury output measurements associated with the selected performance measurement. In one embodiment, the optimization server 50 may be configured to access the injury output measurement data file 62 (FIG. 8) being stored in the database 54 and retrieve the associated physical injury output measurements from the injury output measurement data file 62. In another embodiment, the optimization server 50 may display an optimization screen 72 (FIG. 18) configured to receive the physical injury output measurements from the user via the user computing device 56.

The optimization server 50 is configured to calculate each selected performance measurement value using the corresponding parameter equations and the selected finite element factors 66. The optimization server 50 is also configured to adjust the values of the finite element factors 66 to optimize the finite element factor values to minimize the difference between the calculated performance measurement values and the corresponding physical injury output measurements values. For example, in one embodiment, optimization server 50 is configured to conduct an iterative calculation of the sum of squared errors between the calculated performance measurement values and the physical injury output measurement values using Equation (1) above, to optimize the finite element factor values that minimize the calculated total error.

Figure 4:
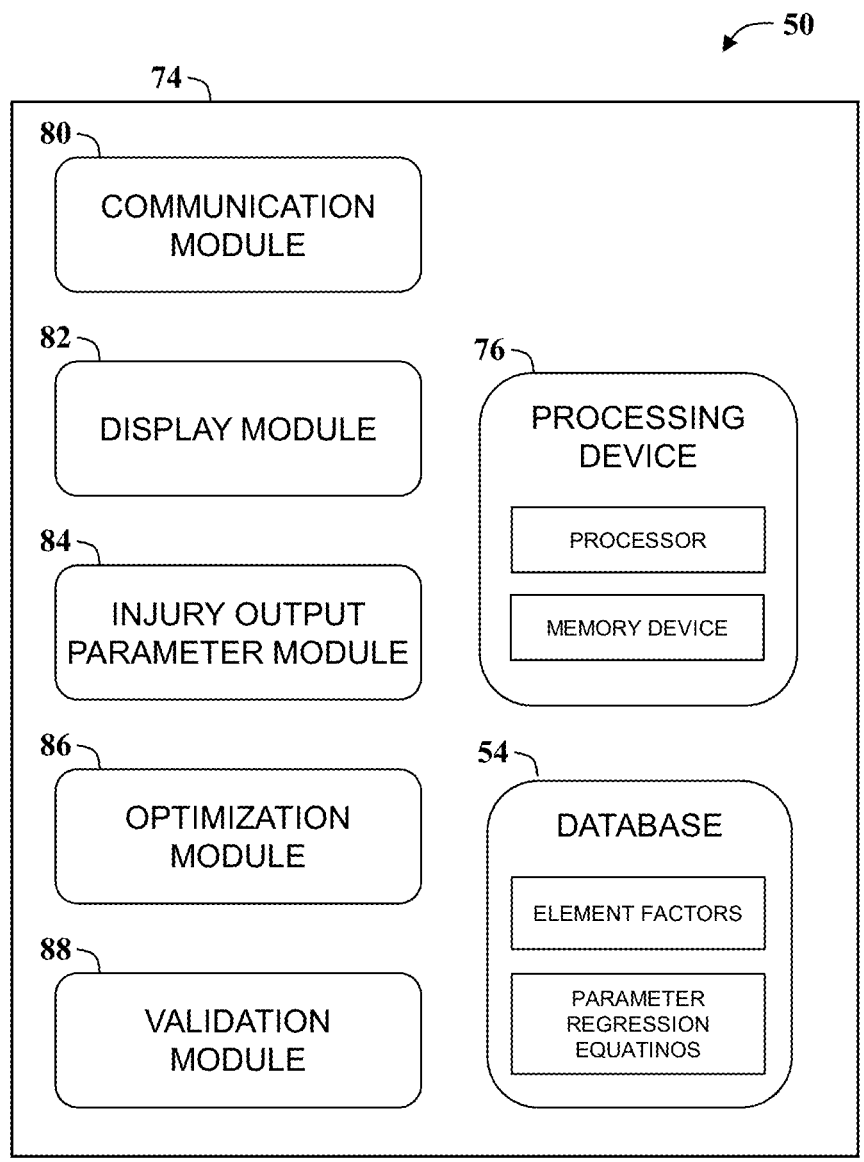
FIG. 4 is a schematic view illustrating example components of a server computer that may be used with the system shown in FIG. 1, according to an embodiment of the present invention.

Referring to FIG. 4 in the illustrated embodiment, the optimization server 50 includes a server computer 74 that includes a processing device 76 that is coupled to the component database 54, a communication module 80, a display module 82, an injury output parameter module 84, and optimization module 86, and a validation module 88. The processing device 76 includes one or more processors that are coupled to a memory device. In addition, the processing device 76 executes various programs, and thereby controls components of the server computer 74 according to user instructions received from the user computing devices 56 to enable users to interact with the server computer 74. For example, in the illustrated embodiment, the processor is programmed to retrieve information being stored within the database 54 and execute application programs to generate the finite element models.

The communication module 80 is configured to transmit and receive information from the user computing devices 56, the database server 52, and/or the certification testing server 48. For example, in one embodiment, the communication module 80 is configured to transmit and receive information over the communications network 58 to enable a user to access the system 10 using a user computing device 56.

The display module 82 is configured to generate and display computer generated images on the user computing devices 56 to display information to the user to enable the user to operate the system 10. For example, the display module 82 is configured to generate and display the optimization screen 72 (FIG. 18) on a user computing device 56 to display information to the user and to receive information from the user via user-inputs received via the optimization screen 72 being displayed on the user computing device 56. In one embodiment, the display module 82 may display the optimization screen 72 with a user-input area 90 (FIG. 18) for receiving information provided by the user using the user computing device 56.

The injury output parameter module 84 is configured to communicate with the certification testing server 48 to receive information associated with the physical inverse impact testing of physical hardware dummy models being conducted using the inverse impact testing apparatus. For example, in one embodiment, the injury output parameter module 84 is configured to receive injury output measurements from the certification testing server 48 and generate and store the injury output measurement data file 62 in the database 54. In another embodiment, the injury output parameter module 84 may receive the information associated with the physical injury output measurements from a user via user-defined input received via the user-input area 90 displayed on the optimization screen 72 and store the user-defined injury output measurements in the injury output measurement data file 62.

The optimization module 86 is configured to calculate the performance measurement values using the parameter equations and the selected finite element factors 66, and to adjust the values of the finite element factors 66 to optimize the finite element factor values to minimize the difference between the calculated performance measurement values and the corresponding physical injury output measurements values. For example, in one embodiment, the optimization module 86 is configured to conduct an iterative calculation using Equation (1) described above, to determine the optimized finite element factor values that minimize the calculated total error.

In one embodiment, the optimization module 86 is also configured to generate the parameter equations using a design of experiments (DOE) algorithm solution for each individual parameter (Y1, Y2, Y3, . . . Ym) in terms all the defined factors (X1, X2, X3, . . . Xn). For example, the optimization module 86 may be configured to use DOE Factorial design to obtain one regression equation for each injury output measurement (parameter) in relation to the five input factors ($X_1$, $X_2$, $X_3$, $X_4$, and $X_5$) during inverse certification load case. The optimization module 86 may be configured to generate a DOE Matrix 92 (shown in FIG. 9) including each finite element factor and generate a regression equation for each performance measurement value. The optimization module 86 may also be configured to generate and display regression equation screens 94 (shown in FIGS. 10-17) for each performance measurement value, including information associated with the corresponding regression equation and the influence the element factors have on the regression analysis.

The validation module 88 is configured to receive the optimized finite element factor values from the optimization module 86 and generate a validated finite element model of the crash test dummy or pedestrian dummy model 28. It should be appreciated that a method of modeling for crash test dummy finite element models is disclosed in U.S. Pat. No. 9,043,187 to Pang, the disclosure of which is hereby incorporated in its entirety by reference.

Figure 19:
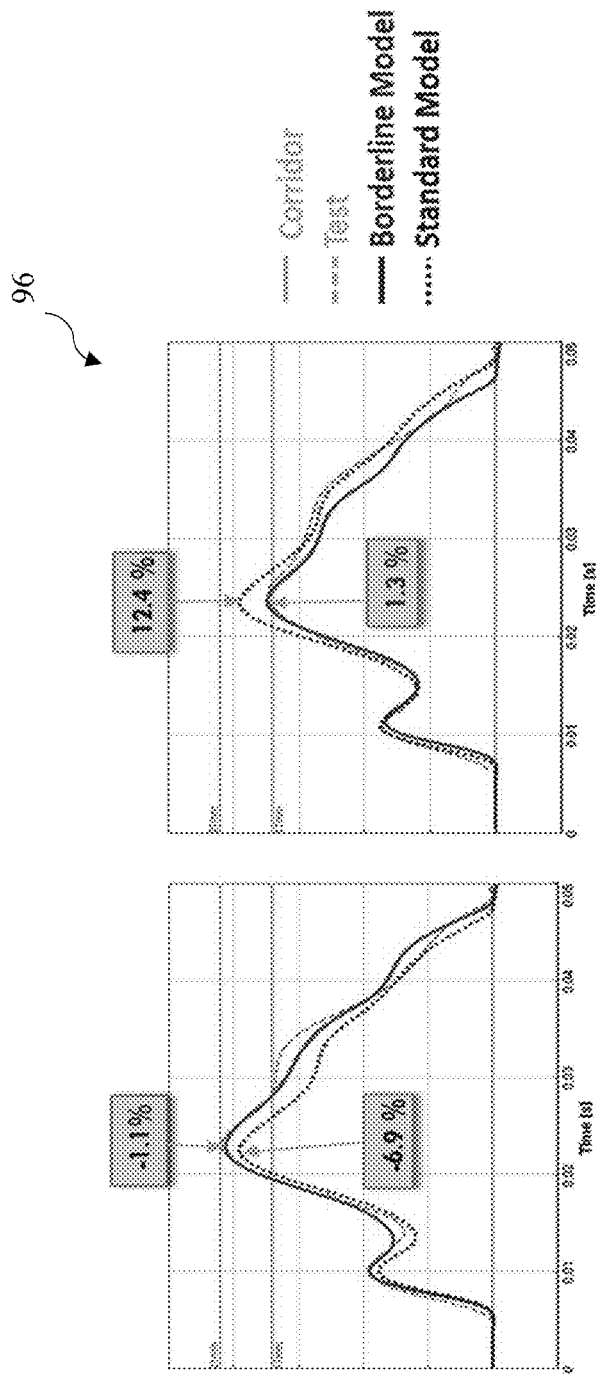
FIGS. 19-21 are illustrations of specific hardware and tests for the customized response finite element model; and Corresponding reference characters indicate corresponding components throughout the several views of the drawings.
Figure 20:
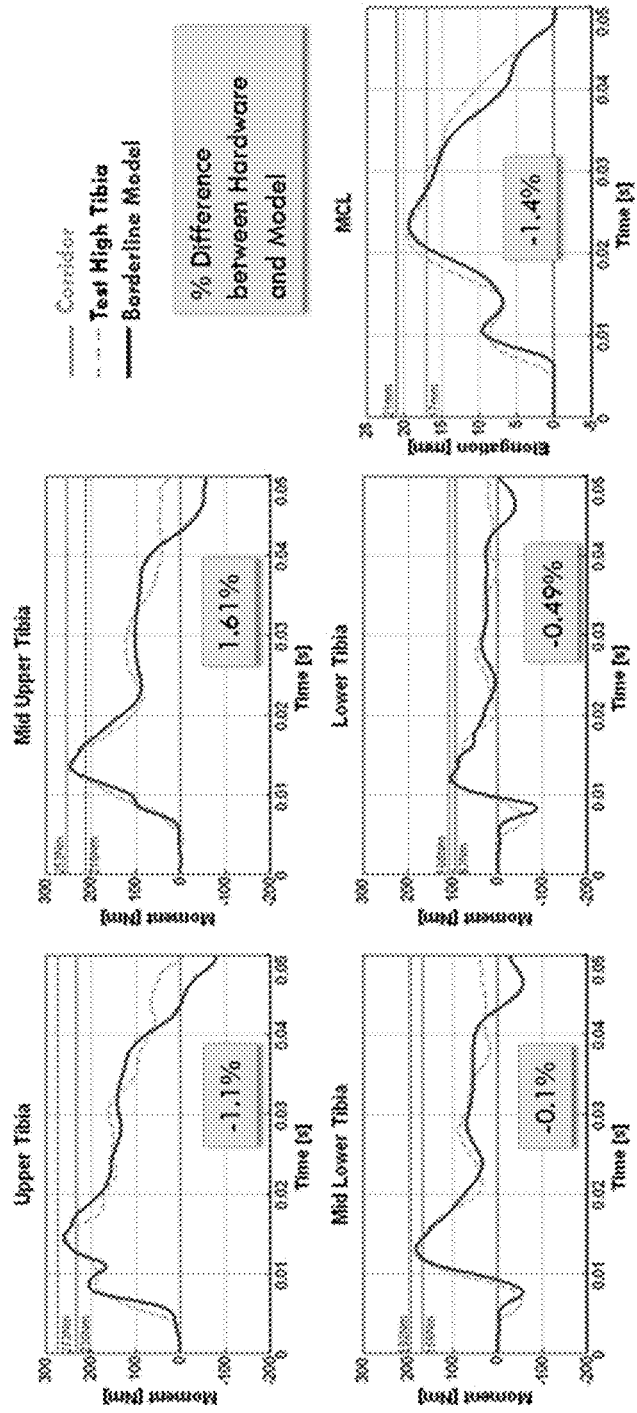
Figure 21:
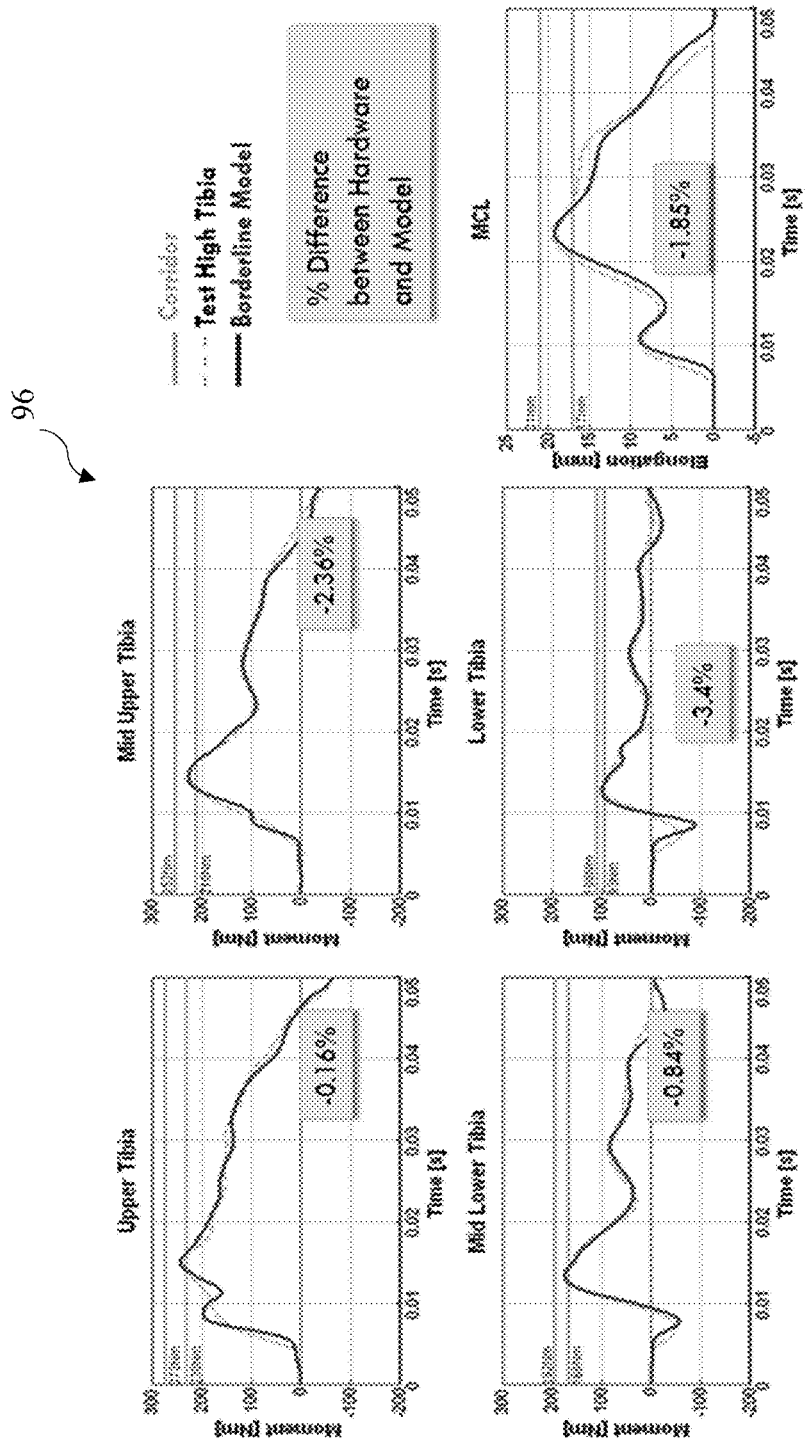

In one embodiment, the validation module 88 calculates each performance measurement value using the optimized finite element factors and generates and displays validation screens 96 (shown in FIGS. 19-21) on the user computing device 56 that display traces indicating the calculated performance measurement value and the injury output measurements received from the physical inverse impact testing of physical hardware dummy models.

In one embodiment, the server computer 74 is configured to select a plurality of finite element factors associated with a crash test dummy, select a performance parameter associated with the crash test dummy, and identify a certification test value associated with the selected performance parameters. In one embodiment, the plurality of finite element factors indicate physical attributes associated with the crash test dummy.

In addition, the server computer 74 determines a performance parameter value as a function of the plurality of finite element factors and determines an optimized factor value for each of the finite element factors to minimize a difference between the performance parameter value and the certification test value. In addition, the server computer 74 generates a finite element model for the crash test dummy using the optimized value of each of the finite element factors.

In one embodiment, the server computer 74 is configured to determine the performance parameter value using a corresponding injury output measurement regression equation and each of the finite element factors. In addition, the server computer 74 may be configured to generate the corresponding injury output measurement regression equation using design of experiments (DOE) factorial design in relation to the plurality of finite element factors.

In another embodiment, the server computer 74 may be configured to select a plurality of performance parameters, determine a corresponding performance parameter value for each of the plurality of performance parameters as a function of the plurality of finite element factors, identify a corresponding certification test value associated with each of the plurality of performance parameters, and determine the optimized value for each of the finite element factors to minimize the sum of squared errors between each performance parameter value and corresponding certification test value. The server computer 74 may also minimize the sum of squared errors between each performance parameter value and the corresponding certification test value using Equation (1) described above. In addition, each of the optimized factor values may be selected from a corresponding range of values including a minimum factor value and a maximum factor value.

In one embodiment, the server computer 74 is configured to receive a request to generate the finite element model for the crash test dummy from a user computing device, access an element data file being stored in a database and select the plurality of finite element factors associated with the crash test dummy, and access a performance parameter data file and select a plurality of performance parameters associated with the crash test dummy, and identify a parameter equation associated with each of the selected performance parameters. The server computer 74 may also generate and display a finite element factor optimization screen including each selected performance parameter and each selected finite element factor. In addition, the server computer 74 may receive a user-defined certification test value associated with each of the selected performance parameters via a user-input area displayed on the finite element factor optimization screen and determine the optimized factor value for each of the finite element factors to minimize the sum of squared errors between each performance parameter value and each associated user-defined certification test value.

Figure 5:
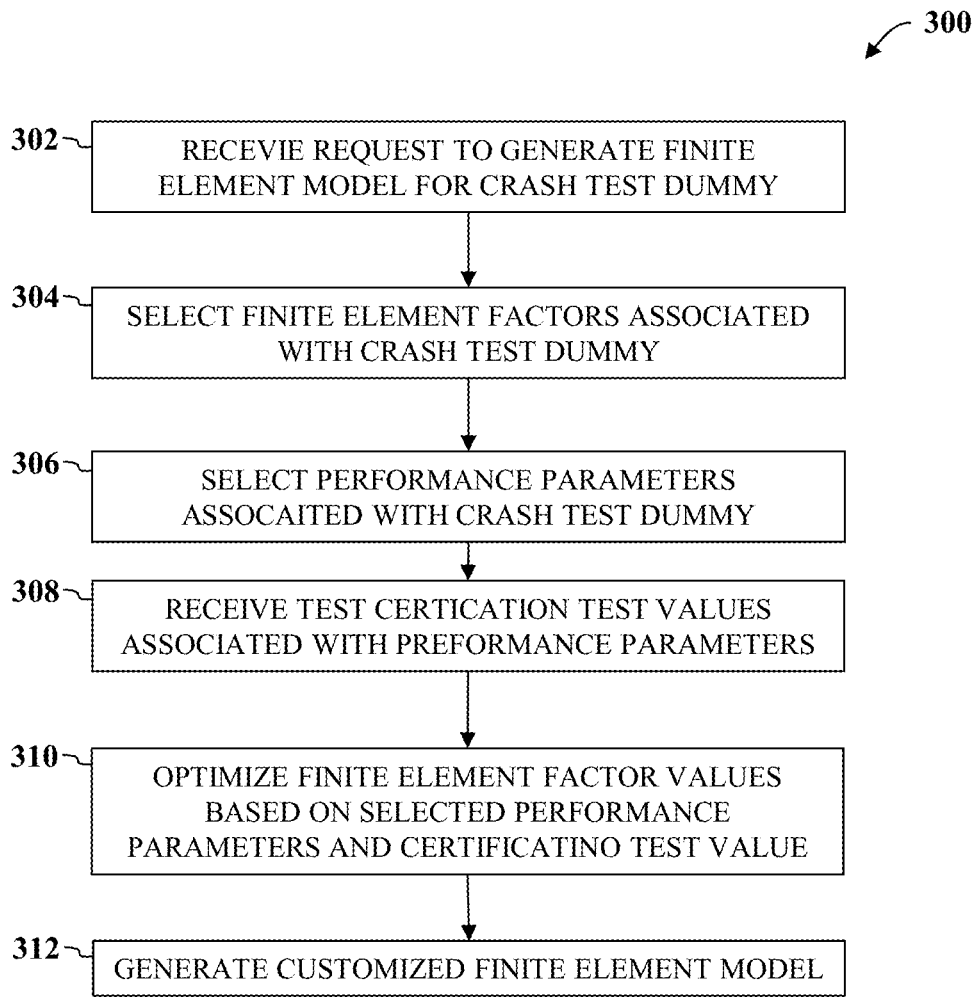
FIG. 5 is a flowchart of a method that may be used with the system shown in FIG. 1, according to an embodiment of the present invention.
Figure 10:
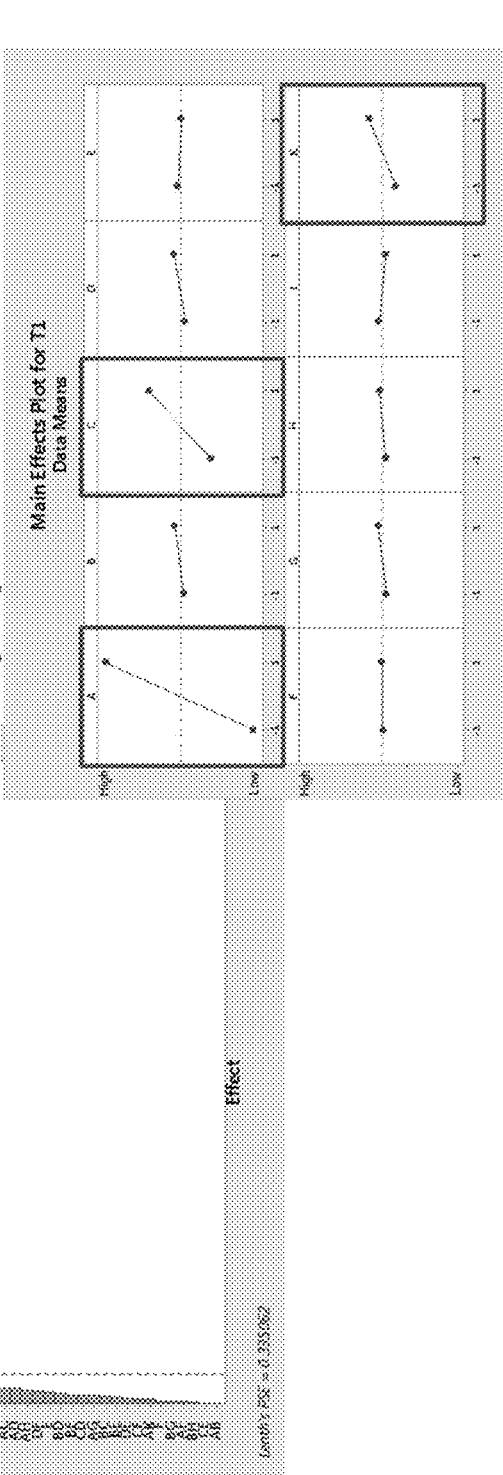
Figure 11:
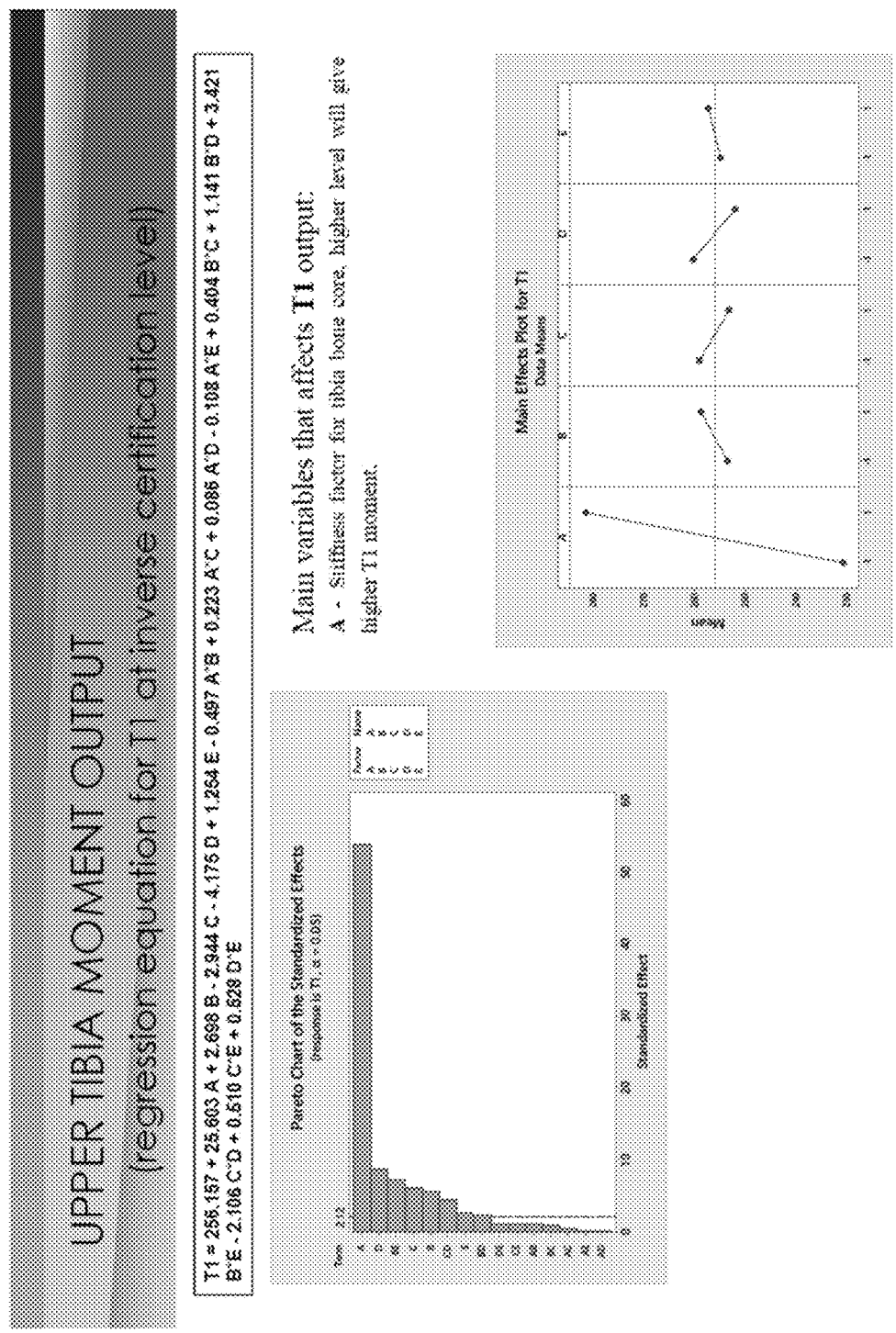
Figure 17:
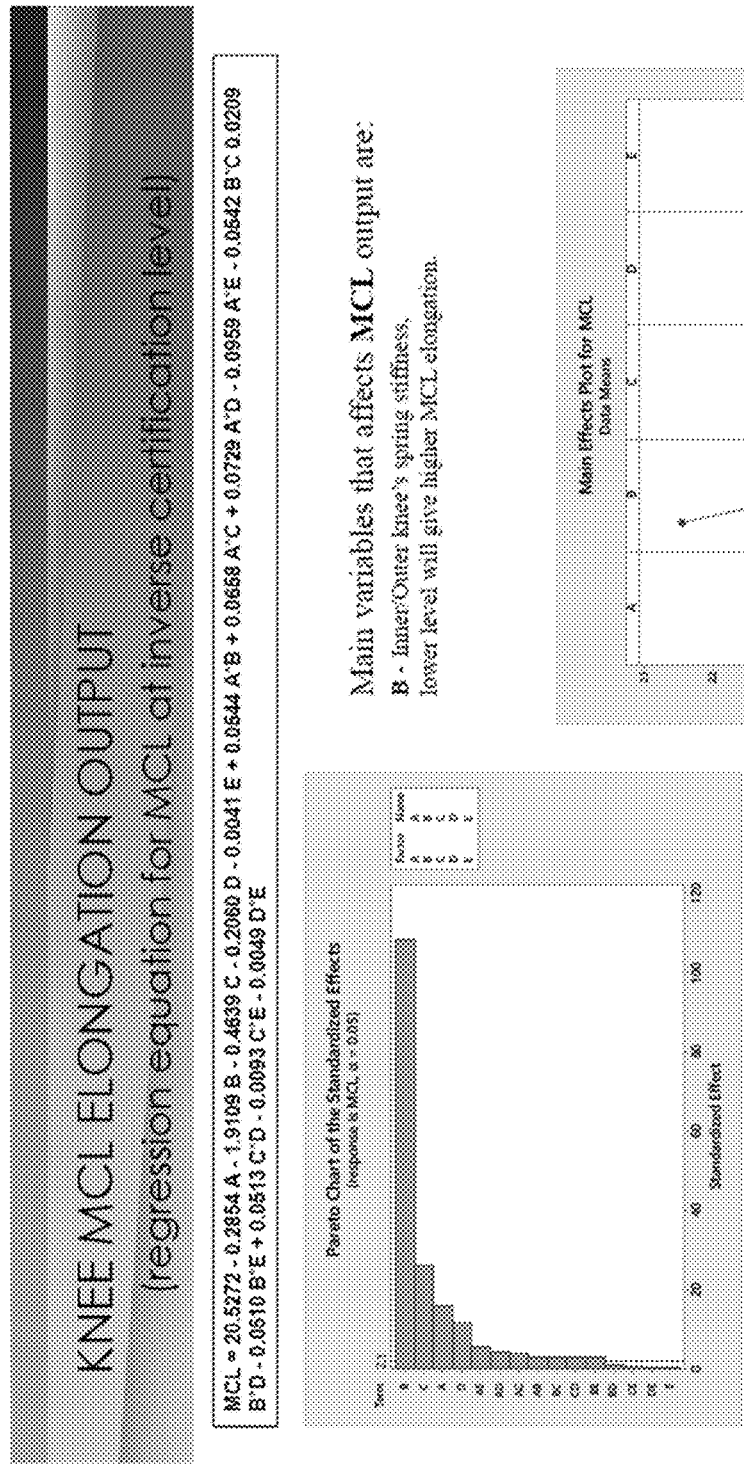

FIG. 5 is a flowchart of a method 300, according to an embodiment of the present invention, that may be used to operate the system 10 to generate customized finite element models of crash test dummies. The methods include a plurality of steps. Each method step may be performed independently of, or in combination with, other method steps. Portions of the methods may be performed by any one of, or any combination of, the components of the system 10.

Referring to FIG. 5, in method step 302, the server computer 74 receives a request to generate a customized response finite element model for a crash test dummy assembly or pedestrian dummy model 28 from a user computing device 56. For example, in one embodiment, the server computer 74 may receive a request to display the optimization screen 72 from a user computing device 56 including a selection of a crash test dummy assembly 28.

In method step 304, the server computer 74 accesses the element data file 64 being stored in the database 54 and selects the element factors associated with the selected crash test dummy assembly or pedestrian dummy model 28.

In method step 306, the server computer 74 selects the performance parameters associated with the crash test dummy or pedestrian dummy model 28. For example, in one embodiment, the server computer 74 may access the performance parameter data file 68 stored in the database 54 and retrieve the performance parameter equations associated with the corresponding performance parameters.

In method step 308, the server computer 74 receives the test certification test values associated with the selected performance parameters. For example, in one embodiment, the server computer 74 may access the injury output measurement data file 62 being stored in the database 54 and retrieve the associated physical injury output measurements from the injury output measurement data file 62. In another embodiment, the server computer 74 may transmit a request to the certification testing server 48 and receive the injury output measurement values from the certification testing server 48. In one embodiment, the server computer 74, may receive user-defined injury output measurement values from the user via the optimization screen 72.

In method step 310, upon receiving the injury output measurement values, the server computer 74 calculates the optimized element factor values based on the selected performance parameters and the received injury output measurement values. For example, in one embodiment, the server computer 74 may conduct iterative calculations of the selected performance parameters using the associated performance regression equations by iteratively selecting element factor values from the corresponding value ranges. The server computer 74 then selects optimized element factor values that minimize the sum of squared errors between the calculated parameter values and the test data value.

In method step 312, the server computer 74 generates the customized finite element model of the crash test dummy or pedestrian dummy model 28 using the optimized element factor values.

A controller, computing device, server or computer, such as described herein, includes at least one or more processors or processing units and a system memory (see above). The controller typically also includes at least some form of computer-readable media. By way of example and not limitation, computer-readable media may include computer storage media and communication media. Computer storage media may include volatile and nonvolatile, removable and non-removable media implemented in any method or technology that enables storage of information, such as computer-readable instructions, data structures, program modules, or other data. Communication media typically embody computer-readable instructions, data structures, program modules, or other data in a modulated data signal such as a carrier wave or other transport mechanism and include any information delivery media. Those skilled in the art should be familiar with the modulated data signal, which has one or more of its characteristics set or changed in such a manner as to encode information in the signal. Combinations of any of the above are also included within the scope of computer-readable media.

The order of execution or performance of the operations in the embodiments of the invention illustrated and described herein is not essential, unless otherwise specified. That is, the operations described herein may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

In some embodiments, a processor, as described herein, includes any programmable system including systems and microcontrollers, reduced instruction set circuits (RISC), application specific integrated circuits (ASIC), programmable logic circuits (PLC), and any other circuit or processor capable of executing the functions described herein. The above examples are exemplary only, and thus are not intended to limit in any way the definition and/or meaning of the term processor.

In some embodiments, a database, as described herein, includes any collection of data including hierarchical databases, relational databases, flat file databases, object-relational databases, object oriented databases, and any other structured collection of records or data that is stored in a computer system. The above examples are exemplary only, and thus are not intended to limit in any way the definition and/or meaning of the term database. Examples of databases include, but are not limited to only including Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

The present invention has been described in an illustrative manner. It is to be understood that the terminology, which has been used, is intended to be in the nature of words of description, rather than of limitation.

Many modifications and variations of the present invention are possible in light of the above teachings. Therefore, the present invention may be practiced other than as specifically described herein.

What is claimed is:

1. A method of creating a customized response finite element model specific to a specific crash test dummy hardware passing certification testing, the method comprising the steps of:

receiving, by at least one processor, a certification test value specific to the specific crash test dummy hardware for each of a plurality of injury output parameters associated with the specific crash test dummy hardware, the injury output parameters for predicting risk of injury through collision testing with the specific crash test dummy hardware, and the certification test values being values generated by the specific crash test dummy hardware during the certification testing;

selecting, by at least one processor, a plurality of finite element factors associated with the specific crash test dummy hardware, the finite element factors corresponding to material stiffness and friction quantities of a finite element model associated with the specific crash test dummy hardware;

retrieving, by the at least one processor, a regression equation for each of the injury output parameters, each of the regression equations being configured to predict a value output by the finite element model associated with the specific crash test dummy hardware for the corresponding injury output parameter at a certification level as a function of each of the finite element factors;

determining, by the at least one processor, an optimized factor value for each of the finite element factors that minimize a difference between the injury output parameter values generated by the regression equations and the certification test values; and generating, by the at least one processor, the customized response finite element model specific to the specific crash test dummy hardware by calibrating the material stiffness and friction quantities of the finite element model associated with the specific crash test dummy hardware according to the determined optimized value for each of the finite element factors, wherein the generated customized response finite element model corresponds to the specific crash test dummy hardware at the certification level for predicting the behavior of the specific crash test dummy hardware in a collision test through simulated collision testing with the generated customized response finite element model.

2. A method as set forth in claim 1, wherein the plurality of finite element factors correspond to physical attributes associated with the specific crash test dummy hardware.

3. A method as set forth in claim 1, further comprising the step of determining the optimized factor value for each finite element factor that minimize the sum of squared errors between the injury output parameter values generated by the regression equations and the certification test values.

4. A method as set forth in claim 1, further comprising the steps of:
identifying a range of values for each of the finite element factors, including a minimum factor value and a maximum factor value; and
determining the optimized factor value for each of the finite element factors based on the range of values identified for the finite element factor.

5. A method as set forth in claim 1, further comprising the steps of:
receiving a request to generate the customized response finite element model for the specific crash test dummy hardware from a user computing device;
accessing an element data file stored in a database and reading the plurality of finite element factors associated with the specific crash test dummy hardware from the element data file;
accessing a performance parameter data file stored in the database and reading the plurality of injury output parameters associated with the specific crash test dummy hardware and the regression equation associated with each of the injury output parameters from the performance parameter data file;
generating and displaying a finite element factor optimization screen including each injury output parameter, each finite element factor, and a distinct user-input area for each injury output parameter;
receiving, as the certification test value associated with each injury output parameter, a user-defined certification test value for injury output parameter via the user-input area displayed on the finite element factor optimization screen for the injury output parameter; and
determining the optimized factor value for each of the finite element factors that minimize the sum of squared errors between the injury output parameter values generated by the regression equations and the user-defined certification test values.

6. A method as set forth in claim 1, further comprising running a script that calibrates material cards of the finite element model associated with the specific crash test dummy hardware based on the optimized finite element factor values to generate the customized response finite element model specific to the specific crash test dummy hardware.

7. A method as set forth in claim 1, further comprising:
receiving a first user request to generate a customized response finite element model corresponding to upper extremes of certification corridors associated with the specific crash test dummy hardware;
responsive to receiving the first user request, retrieving from a database first predefined finite element factor values corresponding to the upper extremes of the certification corridors associated with the specific crash test dummy hardware and generating the customized response finite element model corresponding to the upper extremes of the certification corridors associated with the specific crash test dummy hardware based on the first predefined finite element factor values;
receiving a second user request to generate a customized response finite element model corresponding to lower extremes of the certification corridors associated with the specific crash test dummy hardware; and
responsive to receiving the second user request, retrieving from the database second predefined finite element factor values corresponding to the lower extremes of the certification corridors associated with the specific crash test dummy hardware and generating the customized response finite element model corresponding to the lower extremes of the certification corridors associated with the specific crash test dummy hardware based on the second predefined finite element factor values.

8. A method as set forth in claim 1, wherein the plurality of injury output parameters comprise seven injury output parameters, and the plurality of finite element factors comprise five finite element factors.

9. A system for generating a customized response finite element model specific to a specific crash test dummy hardware passing certification testing, the system comprising:
a database including an element data file and a performance parameter data file associated with the specific crash test dummy hardware, the element data file including finite element factors corresponding to material stiffness and friction quantities of a finite element model associated with the specific crash test dummy hardware, and the performance parameter data file including injury output parameters associated with the specific crash test dummy hardware for predicting risk of injury through collision testing with the specific crash test dummy hardware and including an injury output parameter equation for each of the injury output parameters, each of the injury output parameter equations being configured to predict a value output by the finite element model associated with the specific crash test dummy hardware for the corresponding injury output parameter at a certification level as a function of each of the finite element factors; and
one or more processors configured to:
receive a user request to generate the customized response finite element model for the specific crash test dummy hardware from a user computing device; and responsive to receiving the user request:
  access the element data file associated with the specific crash test dummy hardware stored in the database and read the finite element factors from the element data file;
  access the performance parameter data file associated with the specific crash test dummy hardware stored in the database and read the injury output parameters and equations from the performance parameter data file;
  receive a certification test value specific to the specific crash test dummy hardware for each of the injury output parameters, the certification test values being values generated by the specific crash test dummy hardware during the certification testing;
  determine an optimized factor value for each of the finite element factors that minimize a difference between the injury output parameter values generated by the injury output parameter equations and the certification test values; and
  generate the customized response finite element model specific to the specific crash test dummy hardware by calibrating the material stiffness and friction quantities of the finite element model associated with the specific crash test dummy hardware according to the determined optimized value for each of the finite element factors, wherein the generated customized response finite element model corresponds to the specific crash test dummy hardware at the certification level for predicting the behavior of the specific crash test dummy hardware in a collision test through simulated collision testing with the generated customized response finite element model.

10. A system as set forth in claim 9, wherein the finite element factors correspond to physical attributes associated with the specific crash test dummy hardware.

11. A system as set forth in claim 9, wherein the one or more processors are further configured to determine the optimized factor value for each finite element factor that minimize the sum of squared errors between the injury output parameter values generated by the injury output parameter equations and the certification test values.

12. A system as set forth in claim 9, wherein the one or more processors are further configured to:
  identify a range of values for each of the finite element factors, including a minimum factor value and a maximum factor value; and
  determine the optimized factor value for each of the finite element factors based on the range of values identified for the finite element factor.

13. A system as set forth in claim 9, wherein the one or more processors are further configured to:
  generate and display a finite element factor optimization screen including each injury output parameter, each finite element factor, and a distinct user-input area for each injury output parameter;
  receive, as the certification test value associated with each injury output parameter, a user-defined certification test value for the injury output parameter via the user-input area displayed on the finite element factor optimization screen for the injury output parameter; and
  determine the optimized factor value for each of the finite element factors that minimize the sum of squared errors between the injury output parameter values generated by the injury output parameter equations and the user-defined certification test values.

14. A system as set forth in claim 9, wherein the one or more processors are further configured to run a script that calibrates material cards of the finite element model associated with the specific crash test dummy hardware based on the optimized finite element factor values to generate the customized response finite element model specific to the specific crash test dummy hardware.

15. A system as set forth in claim 9, wherein the one or more processors are further configured to:
  receive a first user request to generate a customized response finite element model corresponding to upper extremes of certification corridors associated with the specific crash test dummy hardware;
  responsive to receiving the first user request, retrieve from a database first predefined finite element factor values corresponding to the upper extremes of the certification corridors associated with the specific crash test dummy hardware and generate the customized response finite element model corresponding to the upper extremes of the certification corridors associated with the specific crash test dummy hardware based on the first predefined finite element factor values;
  receive a second user request to generate a customized response finite element model corresponding to lower extremes of the certification corridors associated with the specific crash test dummy hardware; and
  responsive to receiving the second user request, retrieve from the database second predefined finite element factor values corresponding to the lower extremes of the certification corridors associated with the specific crash test dummy hardware and generate the customized response finite element model corresponding to the lower extremes of the certification corridors associated with the specific crash test dummy hardware based on the second predefined finite element factor values.

16. A system as set forth in claim 9, wherein the injury output parameters comprise seven injury output parameters and the finite element factors comprise five finite element factors.

17. A computer program product comprising:
  one or more non-transitory computer-readable storage media, having computer-executable instructions embodied thereon, wherein when executed by at least one processor, the computer-executable instructions cause the at least one processor to:
    receive a user request to generate a customized response finite element model specific to a specific crash test dummy hardware passing certification testing; and
    responsive to receiving the user request:
      access an element data file associated with the specific crash test dummy hardware and read a plurality of finite element factors from the element data file, the finite element factors corresponding to material stiffness and friction quantities of a finite element model associated with the specific crash test dummy hardware;
      access a performance parameter data file and read from the performance parameter data file a plurality of injury output parameters associated with the specific crash test dummy hardware for predicting risk of injury through collision testing with the specific crash test dummy hardware and an injury output parameter equation for each of the injury output parameters, each of the injury output parameter equations being configured to predict a value output by the finite element model associated with the specific crash test dummy hardware for the corresponding injury output parameter at a certification level as a function of each of the finite element factors;

receive a certification test value specific to the specific crash test dummy hardware for each of the injury output parameters, the certification test values being generated by the specific crash test dummy hardware during the certification testing;

determine an optimized factor value for each of the finite element factors that minimize a difference between the injury output parameter values generated by the injury output parameter equations and the certification test values; and generate the customized response finite element model specific to the specific crash test dummy hardware by calibrating the material stiffness and friction quantities of the finite element model associated with the specific crash test dummy hardware according to the determined optimized value for each of the finite element factors, wherein the generated customized response finite element model corresponds to the specific crash test dummy hardware at the certification level for predicting the behavior of the specific crash test dummy hardware in a collision test through simulated collision testing with the generated customized response finite element model.

* * * * *